(12) United States Patent
Bhattacharyya et al.

(10) Patent No.: US 8,294,224 B2
(45) Date of Patent: Oct. 23, 2012

(54) DEVICES AND METHODS TO IMPROVE CARRIER MOBILITY

(75) Inventors: Arup Bhattacharyya, Essex Junction, VT (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 935 days.

(21) Appl. No.: 11/398,809

(22) Filed: Apr. 6, 2006

(65) Prior Publication Data

US 2007/0238320 A1    Oct. 11, 2007

(51) Int. Cl.
    *H01L 21/31*     (2006.01)
    *H01L 21/469*    (2006.01)
    *H01L 21/02*     (2006.01)

(52) U.S. Cl. ........... 257/411; 257/E21.21; 257/E21.412; 438/786

(58) Field of Classification Search .................. 438/786; 257/411, E21.21
    See application file for complete search history.

(56) References Cited

U.S. PATENT DOCUMENTS

| | | | |
|---|---|---|---|
| 6,174,820 B1 * | 1/2001 | Habermehl et al. | 438/745 |
| 6,657,276 B1 | 12/2003 | Karlsson et al. | |
| 7,081,395 B2 | 7/2006 | Chi et al. | |
| 7,485,544 B2 | 2/2009 | Forbes et al. | |
| 7,888,744 B2 | 2/2011 | Forbes et al. | |
| 2004/0104405 A1 | 6/2004 | Huang et al. | |
| 2004/0251495 A1 | 12/2004 | Ikuta et al. | |
| 2005/0136606 A1 | 6/2005 | Rulke et al. | |
| 2005/0169055 A1 * | 8/2005 | Lung | 365/185.17 |
| 2005/0199945 A1 * | 9/2005 | Kodama et al. | 257/324 |
| 2005/0224867 A1 * | 10/2005 | Huang et al. | 257/327 |
| 2005/0231237 A1 * | 10/2005 | Chang | 326/41 |
| 2005/0247934 A1 * | 11/2005 | Kitakado et al. | 257/59 |
| 2006/0003597 A1 * | 1/2006 | Golonzka et al. | 438/778 |
| 2006/0027876 A1 * | 2/2006 | Jung et al. | 257/369 |
| 2006/0148181 A1 * | 7/2006 | Chan et al. | 438/289 |
| 2006/0223255 A1 * | 10/2006 | Chen et al. | 438/199 |
| 2006/0234455 A1 * | 10/2006 | Chen et al. | 438/276 |
| 2006/0244074 A1 * | 11/2006 | Chen et al. | 257/371 |
| 2006/0246670 A1 * | 11/2006 | Khemka et al. | 438/285 |
| 2007/0087482 A1 * | 4/2007 | Yeh et al. | 438/120 |
| 2007/0215936 A1 * | 9/2007 | Ko et al. | 257/327 |
| 2008/0029840 A1 | 2/2008 | Forbes et al. | |
| 2009/0108363 A1 | 4/2009 | Forbes et al. | |

OTHER PUBLICATIONS

Chu, T. L., et al., "Films of silicon nitride-silicon dioxide mixtures", *J. Electrochem. Soc.*, 115, (1968),318-321.

Forbes, Leonard, "Non-Volatile Memory Device With Tensile Strained Silicon Layer", U.S. Appl. No. 11/260,339, filed Oct. 27, 2005 (Client Ref. No. 05-0753), 26 pages.

Ghani, T., "A 90nm High Volume Manufacturing Logic Technology Featuring Novel 45nm Gate Length Strained Silicon CMOS Transistors", *Technical Digest IEEE International Electron Devices Meeting*, (Dec. 2003),978-980.

(Continued)

*Primary Examiner* — Kiesha Bryant
*Assistant Examiner* — Igwe U Anya
(74) *Attorney, Agent, or Firm* — Schwegman, Lundberg & Woessner, P.A.

(57) ABSTRACT

Electronic apparatus and methods of forming the electronic apparatus include a silicon oxynitride layer on a semiconductor device for use in a variety of electronic systems. The silicon oxynitride layer may be structured to control strain in a silicon channel of the semiconductor device to modify carrier mobility in the silicon channel, where the silicon channel is configured to conduct current under appropriate operating conditions of the semiconductor device.

61 Claims, 18 Drawing Sheets

OTHER PUBLICATIONS

Goto, K., "Technology Booster using Strain-Enhancing Laminated SiN (SELS) for 65nm Node Hp MPUs", *IEDM Technical Digest. IEEE International Electron Devices Meeting*, (Dec. 2004),209-212.

Komoda, T., "Mobility Improvement for 45nm Node by Combination of Optimized Stress Control and Channel Orientation Design", *IEEE International Electron Devices Meeting, 2004. IEDM Technical Digest.*, (Dec. 2004),217-220.

Pidin, S., "A Novel Strain Enhanced CMOS Architecture Using Selectively Deposited High Tensile and High Compressive Silicon Nitride Films", *IEEE International Electron Devices Meeting, 2004. IEDM Technical Digest.*, (Dec. 2004),213-216.

Rand, M. J., et al., "Silicon oxynitride films from the $NO$-$NH_3$-$SiH_4$ reaction", *Journal of the Electrochemical Society*, 120(3), (Mar. 1973),446-453.

Reinberg, A. R., "Plasma deposition of inorganic silicon containing films", *Journal of Electronic Materials*, 8(3), (May 1979),345-75.

Reinberg, Alan R., "Plasma Deposition of Inorganic Thin Films", *Ann. Rev. Mater. Sci.*, 9, (Aug. 1979),341-372.

Reinberg, A., "RF plasma deposition of inorganic films for semiconductor application"., *Journal of the Electrochemical Society*, 121(3), (Mar. 1974),85C.

Subbanna, Seshadri, "High-Performance Silicon-Germanium Technology", *63rd Device Research Conference Digest, 2005. DRC '05.*, (2005),195-196.

* cited by examiner

US 8,294,224 B2

DEVICES AND METHODS TO IMPROVE CARRIER MOBILITY

TECHNICAL FIELD

This application relates generally to electronic devices and device fabrication.

BACKGROUND

Various techniques are being applied to increase the performance of semiconductor devices. One approach is to enhance the carrier mobility in current-carrying regions of a device. Carrier mobility in a silicon channel may be enhanced by altering the strain in the silicon channel. Strained silicon technology has been shown to enhance carrier mobility in both n-channel metal oxide semiconductor field effect (NMOS) transistors and p-channel metal oxide semiconductor field effect (PMOS) transistors. Enhanced carrier mobility may be used as a means to improve device speed and performance. Currently, strained silicon layers are used to increase electron mobility in n-channel complementary metal oxide semiconductor (CMOS) transistors. There has been research and development activity to increase the hole mobility of p-channel CMOS transistors using strained silicon germanium layers on silicon.

More recently, strained silicon layers have been fabricated on thicker relaxed silicon germanium (SiGe) layers to improve the mobility of electrons in NMOS transistors. Wafer bending has been used to investigate the effect of strain on mobility and distinguish between the effects of biaxial stress and uniaxial stress. Stress can also be introduced by wafer bonding. Packaging is another technique to introduce mechanical stress by bending.

Electron mobility in NMOS transistors has been improved using a tensile strained silicon layer on silicon germanium. Uniaxial compressive stress can be introduced in a channel of a PMOS transistor to improve hole mobility using silicon germanium source/drain regions in trenches adjacent to the PMOS transistor. Silicon-carbon source/drain regions in trenches adjacent to an NMOS transistor can introduce tensile stress and improve electron mobility. Silicon nitride capping layers can be formed to introduce tensile stress for NMOS transistors and can be formed to introduce compressive stress for PMOS transistors. However, there continues to be a need to provide fabrication processes and structures to enhance carrier mobility to improve performance of semiconductor devices.

DETAILED DESCRIPTION

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments disclosed herein are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include semiconductor wafers. Both wafer and substrate can include doped and undoped semiconductors, epitaxial semiconductor layers supported by a base semiconductor or insulator (e.g. silicon on insulator, SOI, substrate), as well as other semiconductor structures well known to one skilled in the art. The following detailed description is, therefore, not to be taken in a limiting sense, and the scope of the present invention is defined only by the appended claims, along with the full scope of equivalents to which such claims are entitled.

In an embodiment, a method includes forming a silicon oxynitride layer on a semiconductor device, in which the semiconductor device has a silicon channel to conduct current. The composition and properties of the silicon oxynitride layer may be structured to control stress/strain in the silicon channel.

Figure 1:
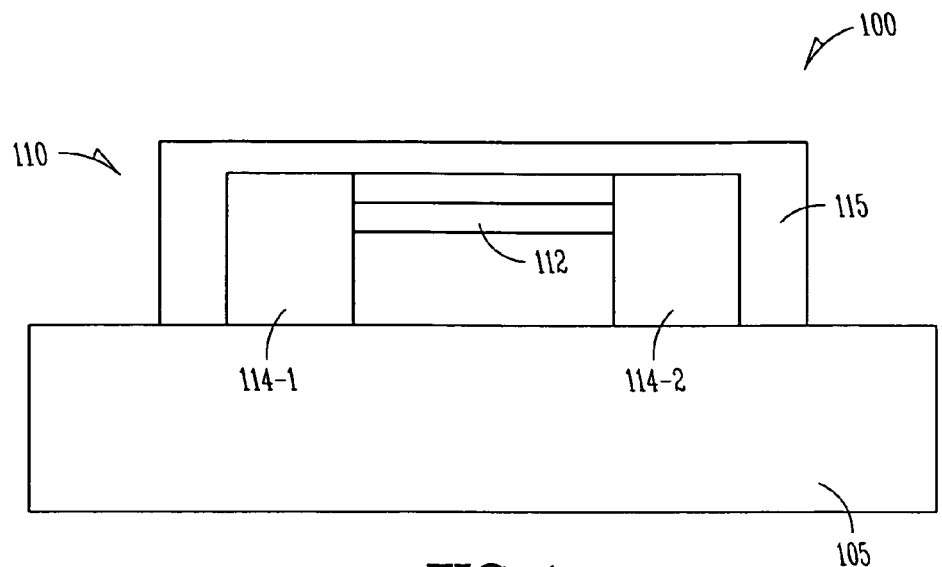
FIG. 1 shows a representation of an embodiment of an electronic apparatus having a semiconductor device that includes a silicon channel to conduct current, in which strain in the silicon channel is controlled by a silicon oxynitride layer on the semiconductor device.

FIG. 1 shows a representation of an embodiment of an electronic apparatus 100 having a semiconductor device 110 that includes a silicon channel 112 to conduct current, in which strain in silicon channel 112 is controlled by a silicon oxynitride layer 115 on semiconductor device 110. Channel 112 provides a conductive path between carrier source 114-1 and carrier sink region 114-2 in semiconductor device 110. Semiconductor device is formed on a substrate 105. Silicon oxynitride layer 115 on semiconductor device 110 includes silicon oxynitride layer 115 disposed within the semiconductor device 100 to control strain or associated stress in silicon channel 112. Silicon oxynitride layer 115 may be disposed on portions of an active region of a semiconductor device in which silicon channel 112 is configured. A silicon channel to conduct current is a path in which carriers may flow under appropriate conditions. Silicon channel 112 may be a controllable conduction path, in which current flow in silicon channel 112 can be regulated from no current to a maximum current for given operating conditions. Silicon oxynitride layer 115 may be used to introduce compressive or tensile stress in silicon channel 112, depending on the selected composition of silicon oxynitride layer 115. Providing stress/strain of an appropriate polarity (compressive or tensile) may enhance mobility in silicon channel 112. Silicon oxynitride layer 115 may be structured to introduce compressive stress/strain to improve hole mobility in silicon channel 112. Silicon oxynitride layer 115 may be structured to introduce tensile stress/strain to improve electron mobility in silicon channel 112. The enhanced mobility may result in more drain current for a given device dimension, which may result in improved performance such as faster switching speeds for applications in which silicon channel 112 is configured relative to switching designs. Semiconductor device 110 may include, but is not limited to, field effect transistors (FETs), CMOS devices, general CMOS technology structures for memory applications, general CMOS technology structures for logic applications, memory devices, and logic applications.

High temperature chemical vapor deposited (CVD) silicon oxynitrides are a generic group of insulators best described as an amorphous polymer of silicon, oxygen and nitrogen. The oxygen/nitrogen ratio, the refractive indices, and the chemical etch rates for these insulators cover the entire range between $SiO_2$ and $Si_3N_4$. Additionally, the mechanical properties such as stress and strain produced by depositing silicon oxynitride on a silicon substrate vary from tensile (like $SiO_2$) for oxygen-rich silicon oxynitride to highly compressive (like $Si_3N_4$) for nitrogen-rich silicon oxynitride. Silicon oxynitride, SiON, may have various compositions with different ratios of oxygen and nitrogen bonded with silicon. A silicon oxynitride composition may include $SiO_{1.75}N_{0.25}$ ($N_N/(O_N+N_N)=0.125$), which is a stress-free silicon oxynitride. Each silicon oxynitride composition based on oxygen/nitrogen content may be characterized uniquely with respect to its electrical and optical properties. For example, with the refractive index for silicon dioxide, $SiO_2$, being about 1.46 and the refractive index for $Si_3N_4$ being 2.0, the refractive index for silicon oxynitride falls between 1.46 and 2.0, the value of which provides a measure of the composition of the oxynitrides. Other properties, such as, but not limited to, chemical etch rates, can be characterized as a function of their composition, which may also be characterized by the refractive index for the composition.

In an embodiment, a silicon oxynitride layer may be deposited on a semiconductor device by high temperature chemical vapor deposition (CVD) to provide a means to regulate the stress/strain in a silicon channel of the semiconductor device. Herein, high temperature CVD means chemical vapor deposition at 750° C. or higher. In an embodiment, a silicon oxynitride layer may be deposited on a semiconductor device by atomic layer deposition (ALD) to provide a means to regulate the stress/strain in a silicon channel of the semiconductor device. Alternatively, other deposition techniques may be used to deposit silicon oxynitride on a semiconductor device to provide a means to regulate the stress/strain in a silicon channel of the semiconductor device. In an embodiment, a CMOS structure may be formed in which a high temperature CVD silicon oxynitride, for spacers and/or capping layer films, may be selectively deposited over the PMOS transistor of a desired composition of silicon oxynitride for compressive stress (and associated compressive strain), while selectively depositing a different composition of oxynitride over the NMOS transistor for tensile stress (and associated tensile strain) using a similar high temperature CVD process. The composition of silicon oxynitride film may be controlled by altering the concentration of reacting gases viz. $SiH_4$ (for silicon), $NH_3$ (for nitrogen) and $N_2O$ (for oxygen) during the CVD deposition process. By depositing silicon oxynitride with different flow of oxygen, nitrogen, and silicon, an entire range of silicon oxynitrides may be generated, where each one, depending on the atomic concentrations, can be characterized by its refractive indices. Silicon oxynitride spacers and/or capping layers may be used to introduce both compressive and tensile stress in CMOS devices in this approach. Significant enhancement in electron and hole mobility may be achieved in MOSFETs in a CMOS device with the silicon in the channel region strained tensile for electrons (NMOS) and compressive for holes (PMOS) for the CMOS devices. The enhanced mobility results in more drain current for a given device dimension and operating conditions, which results in faster switching speeds.

Stressed silicon nitride and silicon oxynitride films can be deposited by reactive or rapid plasma deposition (RPD) or by plasma enhanced CVD (PECVD) processes, which are low temperature processes. Silicon nitride capping layers over the gate of an NMOS flash or non-volatile read only memory (NROM) device may provide tensile stress in the silicon channel when nitride is deposited by lower temperature RPD process. See, U.S. patent application Ser. No. 11/260,339, entitled "TECHNIQUE TO IMPROVE PERFORMANCE AND WRITE EFFICIENCY IN FLASH MEMORIES," which is incorporated herein by reference. The decrease in film thickness and possible rearrangement and out gassing of hydrogen can create large additional stress. These silicon nitride films may contain large amounts of hydrogen and post nitride thermal budget may need to be controlled to ensure the integrity of the film and the associated strain. The challenges associated with the RPD or PECVD processes are to reproducibly control hydrogen concentration in such films and thermal stability of such film during process integration. Additional challenges involve maintaining compositional and structural stability of such films when subjected to subsequent thermal and processing cycles and during the lifetime of application of such devices. RPD or PECVD films may be used to create tensile strain in NMOS flash and NROM memory devices.

Reproducible high quality charge-free oxynitride films were developed during 1974 through 1976, by high temperature CVD process (800° C.-900° C.) with refractive indices in the range of 1.50 to 1.95 by controlling the ratios of ammonia, silane and oxygen. A similar process was also used to produce high quality charge free silicon nitride films of stoichiometry of $Si_3N_4$ (partial pressure of oxygen was reduced to zero) as reference films for comparative physical, mechanical, electrical and chemical characterization of silicon oxynitride films. Different compositions of silicon oxynitride films were subsequently used as gate insulators for MOSFET transistors (both p-channel MOSFETs and n-channel MOSFETs), as tunnel, trapping, and charge blocking insulators for improved MOS non-volatile devices, and as a passivation dielectric for gate insulator reliability for memory and logic technology. Additionally, silicon oxynitride films of stoichiometry: $SiO_{1.75}N_{0.25}$ were found to be virtually a stress-free insulator. Researchers have characterized oxynitrides deposited by the $O_2$—$NH_3$—$SiH_4$ reaction, and correlated several properties such as film density, etch rate, dielectric constant, refractive index and IR absorption on oxygen to $SiH_4$ to $NH_3$ molar ratio during film deposition. However, work done prior to 1974 on silicon oxynitride formation indicated difficulties in controlling interface charge density of those films. Studies by the inventors herein have confirmed the stress free nature of silicon oxynitride films of refractive indices in the range of about 1.53 to about 1.6 with corresponding ratios of atomic nitrogen concentration over the sum-total of atomic nitrogen plus oxygen concentration ranging from 0.125 to 0.2. Silicon oxynitride with this ratio having a value less than 0.125 showed tensile stress/strain, while compositions with this ratio ranging from greater than 0.3 to 1.0 ($Si_3N_4$) showed compressive stress/strain, which increased with increasing nitrogen concentration in the films.

Figure 2:
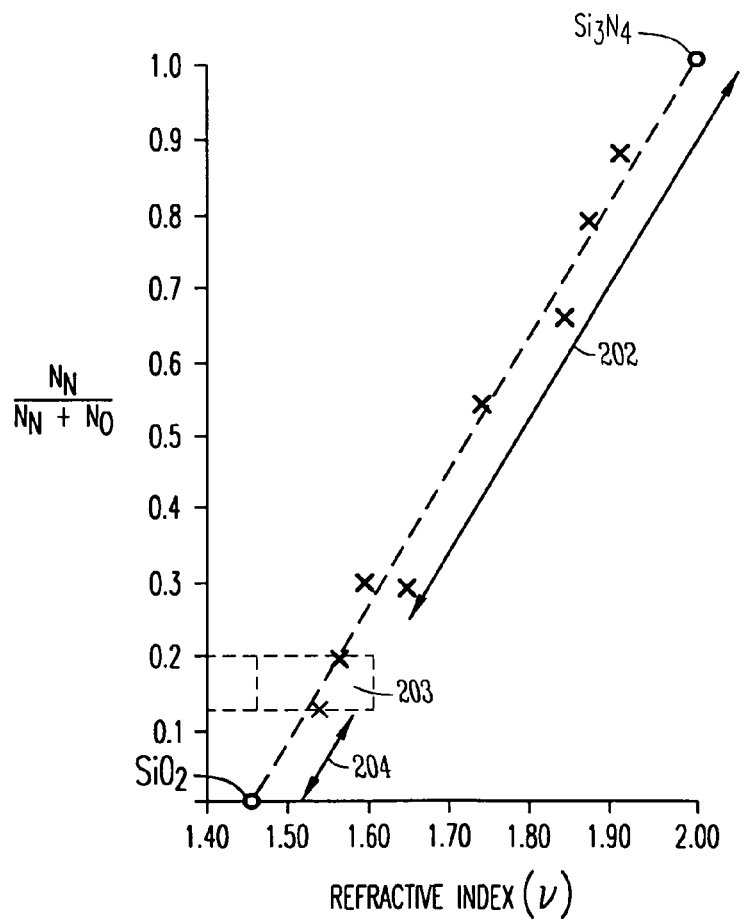
FIG. 2 shows a graph of the ratio of the number of nitrogen atoms to the sum of the number of nitrogen and oxygen atoms in amorphous silicon oxynitride films as a function of the index of refraction, v.

FIG. 2 shows a graph of the ratio of the number of nitrogen atoms to the sum of the number of nitrogen and oxygen atoms in silicon oxynitride films as a function of the index of refraction, v. The silicon oxynitride films were formed by chemical vapor deposition at 900° C. with the ratio determined from Auger analysis. The graph shows region 202 of compressive stress in silicon oxynitride, region 203 for stress-free silicon oxynitride, and region 204 of tensile stress in silicon oxynitride. The graph indicates that by adjusting the amount of nitrogen, oxygen, and silicon in forming a silicon oxynitride film, the silicon oxynitride may be structured to correspond to a selected or predetermined refractive index, hence a desired strain polarity and level of strain.

Figure 3:
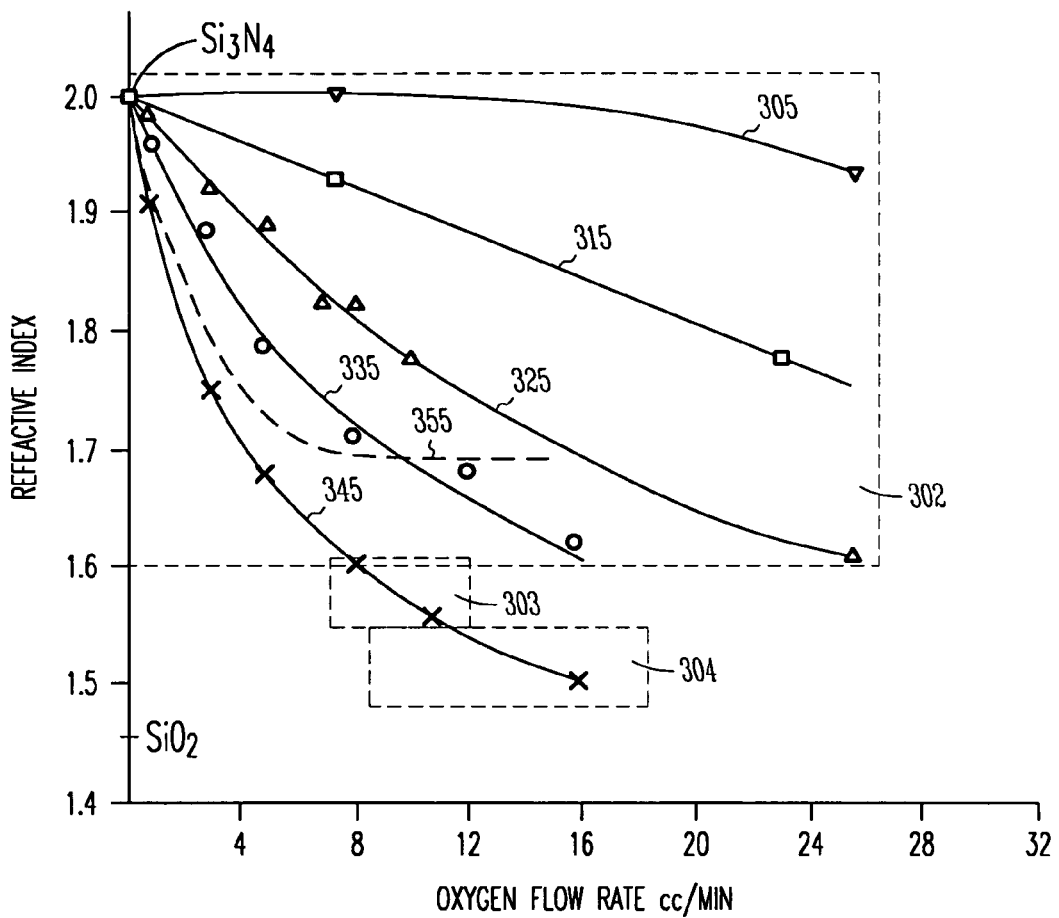
FIG. 3 shows a graph of the refractive index as a function of oxygen flow rate (cc/min) for a set of high temperature chemical vapor deposited silicon oxynitride films.

FIG. 3 shows a graph of the refractive index as a function of oxygen flow rate (cc/min) for a set of silicon oxynitride films. The silicon oxynitride films were formed by chemical vapor deposition at 900° C. with a $NH_3$ flow rate of 1000 c.c./min. Curve 305 shows the refractive index/oxygen flow for a silicon oxynitride film formed in a CVD process having a $NH_3$:$SiH_4$ ratio of 5:1. Curve 315 shows the refractive index/oxygen flow for a silicon oxynitride film formed in a CVD process having a $NH_3$:$SiH_4$ ratio of 15:1. Curve 325 shows the refractive index/oxygen flow for a silicon oxynitride film formed in a CVD process having a $NH_3$:$SiH_4$ ratio of 50:1. Curve 335 shows the refractive index/oxygen flow for a silicon oxynitride film formed in a CVD process having a $NH_3$:$SiH_4$ ratio of 100:1. Curve 345 shows the refractive index/oxygen flow for a silicon oxynitride film formed in a CVD process having a $NH_3$:$SiH_4$ ratio of 333:1. Curve 355 shows the refractive index/oxygen flow for a silicon oxynitride film formed in a CVD process having a $NH_3$:$SiH_4$ ratio of 1000:1. Indicated in the graph are region 302 of compressive stress in silicon oxynitride, region 303 for stress-free silicon oxynitride, and region 304 of tensile stress in silicon oxynitride. The graph indicates that by adjusting the amount of oxygen flow in forming a silicon oxynitride film, the silicon oxynitride may be structured to correspond to a selected or predetermined refractive index, for a known ratio of $NH_3$:$SiH_4$ gases used in the CVD process. In a process using other gases, relationships such as shown in FIG. 3 may be determined for these other gases. In an ALD process, the sequencing of pulsing reactive gases may be permutated to provide a selected refractive index.

Figure 4:
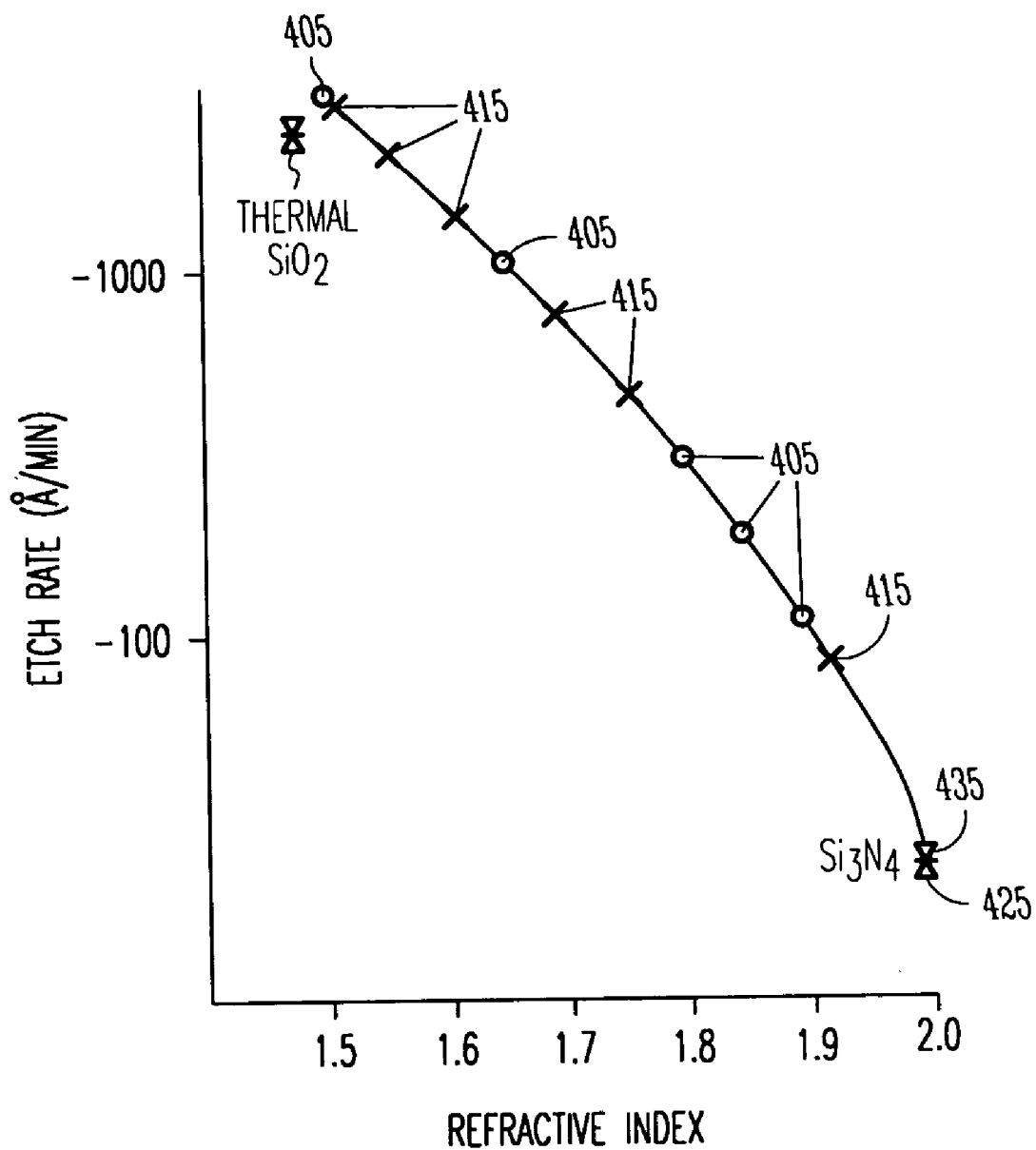
FIG. 4 shows a graph of an etch rate (Å/min.) of silicon oxynitride of FIG. 3 as a function of refractive index.

FIG. 4 shows a graph of an etch rate (Å/min.) of silicon oxynitride as a function of refractive index. The silicon oxynitride films were etched in a 7:1 buffered hydrofluoric acid (BHF) solution at 35° C. Points 405 show the etch rate for a silicon oxynitride film formed in a CVD process having an ammonia-silane ratio of 50:1. Points 415 show the etch rate for a silicon oxynitride film formed in a CVD process having an ammonia-silane ratio of 333:1. Point 425 shows the etch rate for a silicon oxynitride film formed in a CVD process having an ammonia-silane ratio of 5:1. Point 435 shows the etch rate for a silicon oxynitride film formed in a CVD process having an ammonia-silane ratio of 1000:1.

In an embodiment, a CVD technique may be applied to deposit thermally stable tensile stress for NMOS device and simultaneously compressive stress for PMOS device for applicability in both general CMOS technology for memory and logic applications as well as for non-volatile memory technology. In an embodiment, an oxygen-rich silicon oxynitride film as a gate spacer and/or a capping layer for P-FET Flash or P-channel NROM may attain a desired level and polarity of strain. A nitrogen-rich silicon oxynitride film as a gate spacer and/or a capping layer for N-FET Flash or N-channel NROM may attain a desired level and polarity of strain. A high temperature CVD process for depositing the silicon oxynitride may provide thermal stability and enhanced process integration. Such process characteristics may be conveyed to non-volatile flash devices, NROM devices, P-FET devices, N-FET devices, and, in general, for CMOS logic and other memory devices, providing enhanced circuit performance. The polarity of stress or strain in the silicon oxynitride spacer and the silicon oxynitride capping film for P-FET and N-FET devices may be controlled and tailored during the film deposition by appropriately adjusting the oxygen flow rate during the high temperature CVD process of deposition of these films. The oxygen flow adjustment may incorporate an appropriate concentration of oxygen in the deposited films to achieve the desired magnitude and polarity of stress and associated strain in such films.

Figure 5A:
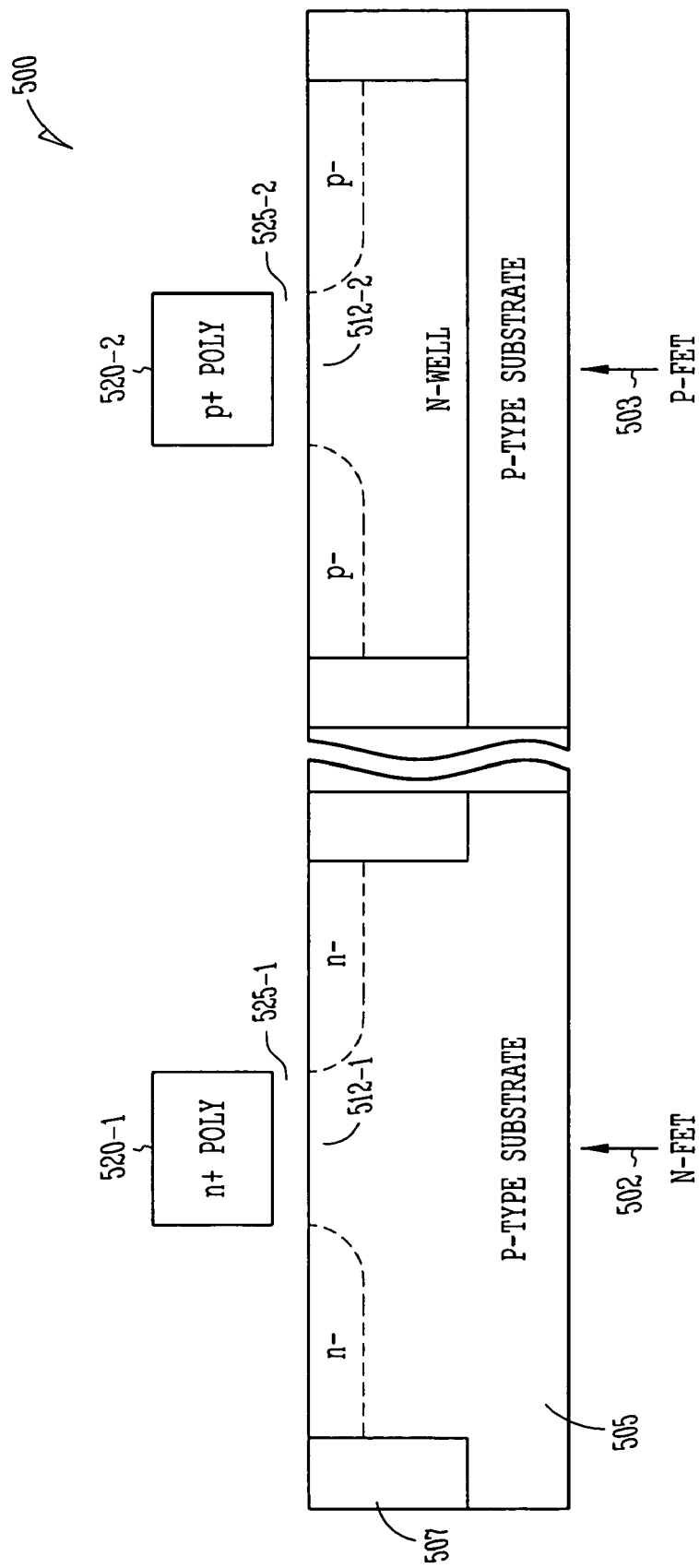
FIGS. 5A-F show features of an embodiment for forming silicon oxynitride spacers to control strain in silicon channels to enhance carrier mobility in these silicon channels.

FIGS. 5A-F show features of an embodiment for forming silicon oxynitride spacers to control strain in silicon channels to enhance carrier mobility in these silicon channels. FIG. 5A shows a stage of formation of spacers containing silicon oxynitride in a structure 500 having a N-FET transistor 502 with a silicon channel 512-1 and a P-FET transistor 503 with a silicon channel 512-2. N-FET 502 and P-FET 503 may be formed in a common fabrication of an integrated circuit. N-FET 502 and P-FET 503 may be transistors in a CMOS device. N-FET 502 and P-FET 503 may be individual transistors of different components on the same substrate 505. Alternatively, N-FET 502 and P-FET 503 may be fabricated separately. At the stage of processing illustrated in FIG. 5A, an isolation oxidation, for example a shallow trench isolation (STI) 507, has been provided, polysilicon gates 520-1, 520-2 have been deposited on gate dielectrics 525-1, 525-2, respectively, with an associated gate etch, and lightly doped drain (LDD) implants have been provided. Polysilicon gate 520-1 may be a heavily doped n-type, $n^+$, polysilicon gate for N-FET 502. Polysilicon gate 520-2 may be a heavily doped p-type, p⁺, polysilicon gate for P-FET 503. The material for the gates is not limited to polysilicon, the gate may be composed of any material that is suitable for use as a gate as is known by those skilled in such arts.

Figure 5B:
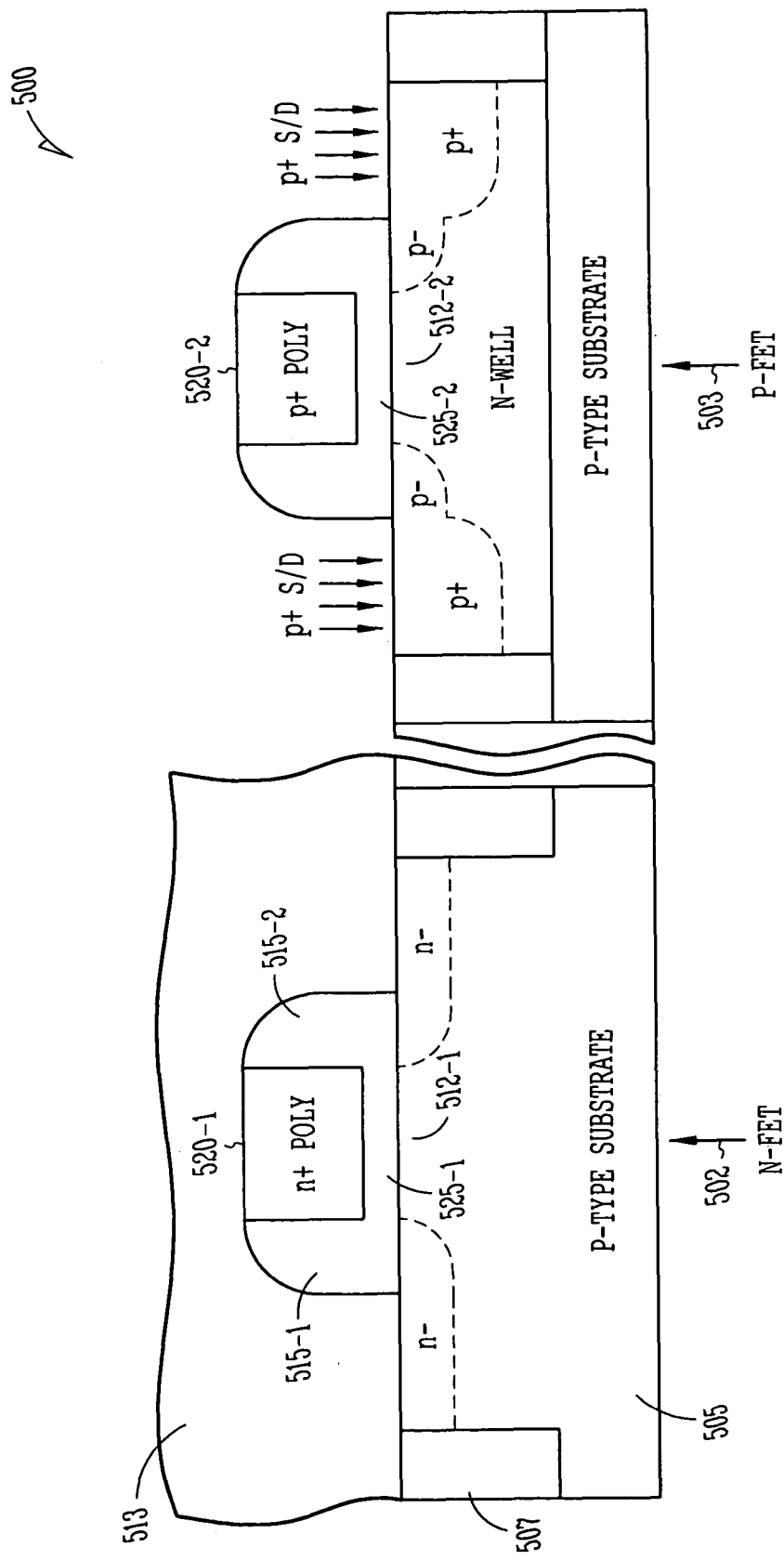

FIG. 5B shows a processing stage subsequent to the stage shown in FIG. 5A. Nitrogen-rich oxynitride, SiON⁺, is deposited. In an embodiment, the SiON⁺ may have an index of refraction of 1.9, which is a SiON composition in compressive stress. The SiON⁺ is etched to form spacers 515-1, 515-2 to provide the desired tensile strain for channel 512-1 of N-FET 502. A block mask 513 may be deposited to protect the N-FET region, when the spacers for P-FET 503 are subsequently removed by a selective etch. The source/drain regions of P-FET 503 are implanted to form p⁺ regions. The resulting structure is shown in FIG. 5B.

Figure 5C:
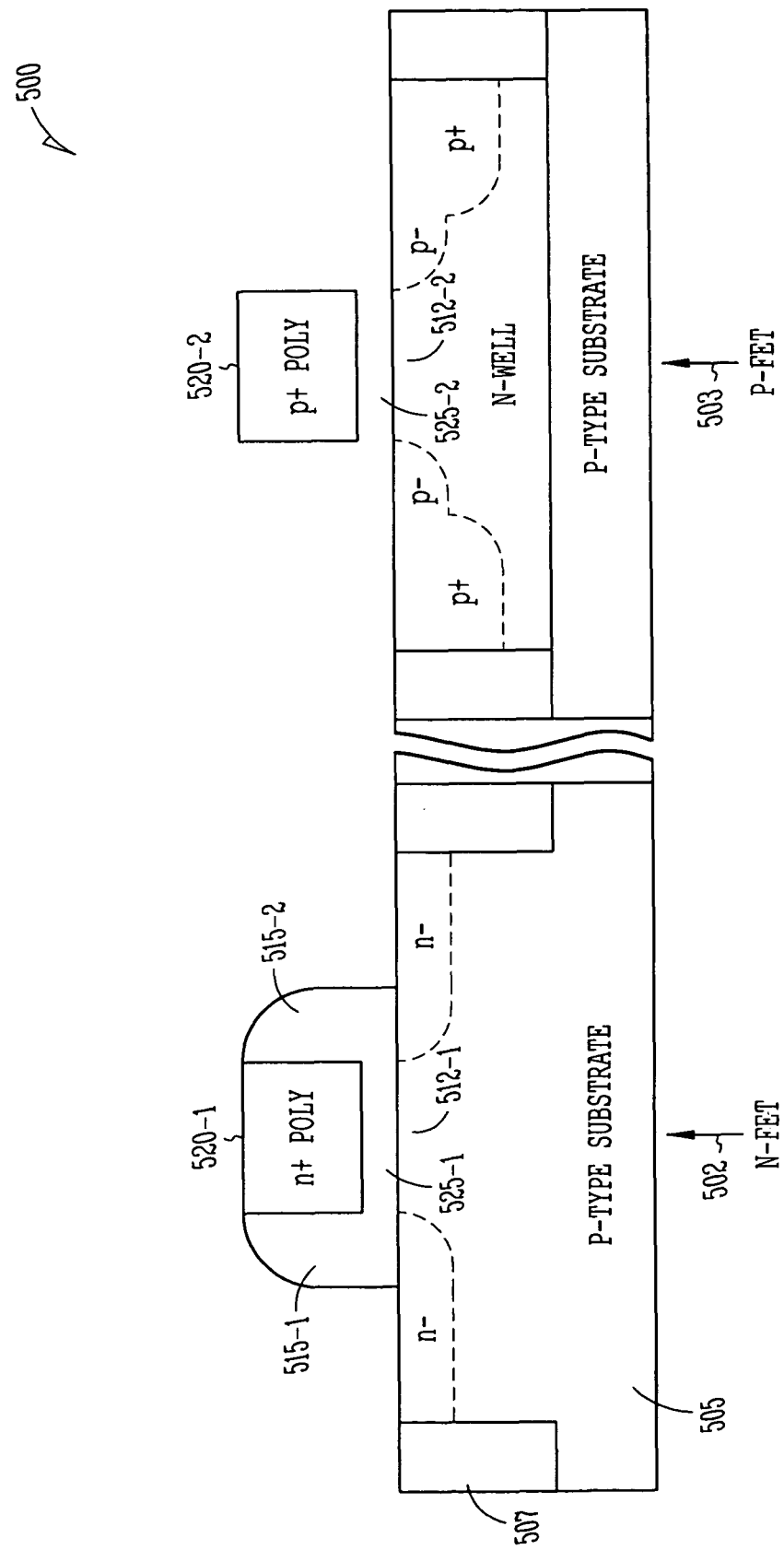

FIG. 5C shows a processing stage subsequent to the stage shown in FIG. 5B. The SiON⁺ spacers adjacent to the polysilicon gate of P-FET 503 may be selectively etched. In an embodiment, the etch discussed with respect to FIG. 4 may be used. Other etchants or etching processes may be used. FIG. 5C also shows structure 500 with the block mask 513 of N-FET 502 removed.

Figure 5D:
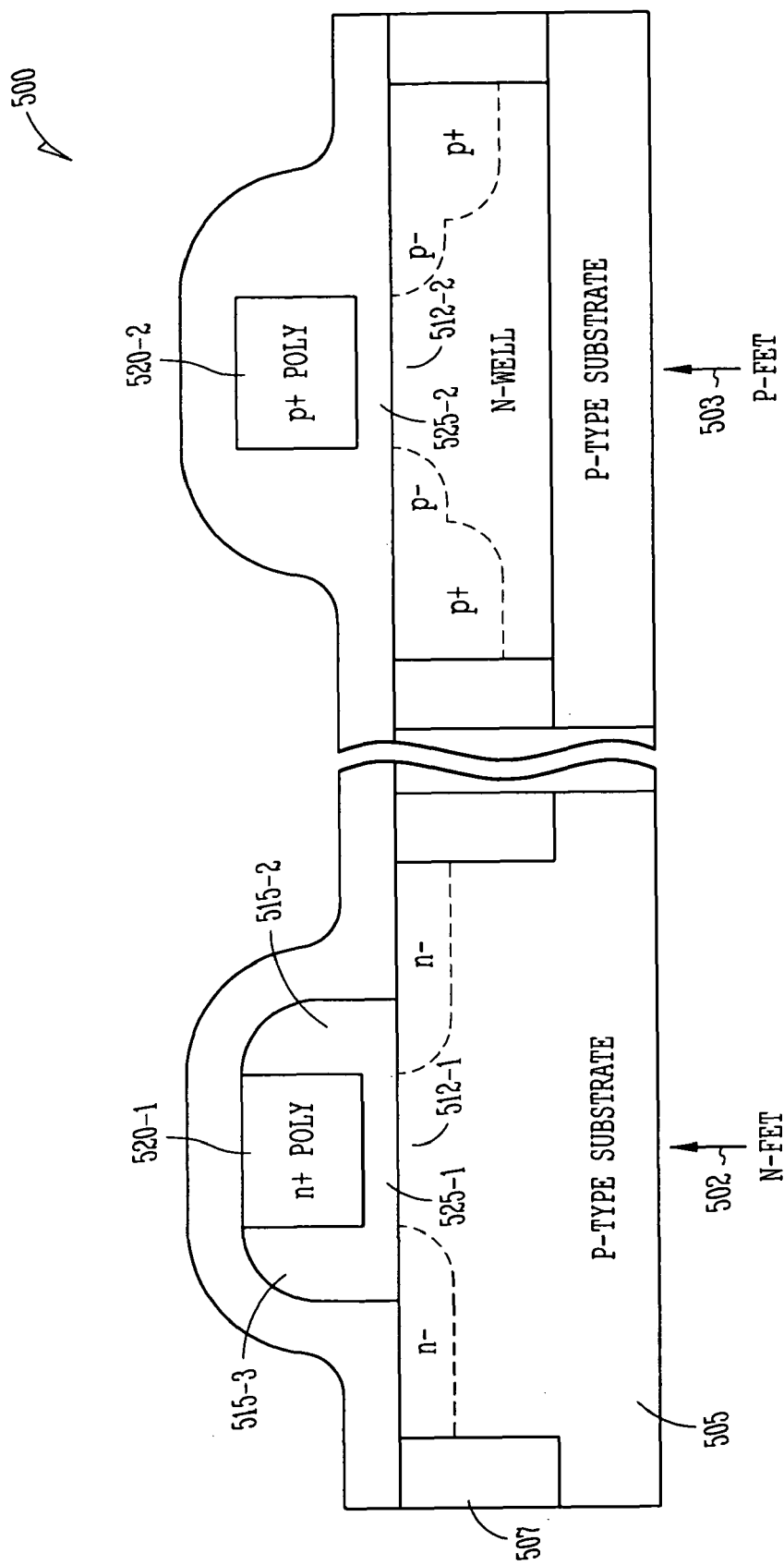

FIG. 5D shows a processing stage subsequent to the stage shown in FIG. 5C. Oxygen-rich oxynitride, SiO⁺N, is deposited. Alternatively, a SiO⁺N layer may be deposited over P-FET regions with an oxide or other insulator deposited over N-FET regions. In an embodiment, the SiO⁺N may have a refractive index of about 1.53 or less, which is a SiON composition in tensile stress. This would provide the desired compressive strain for channel 512-2 of P-FET 503.

Figure 5E:
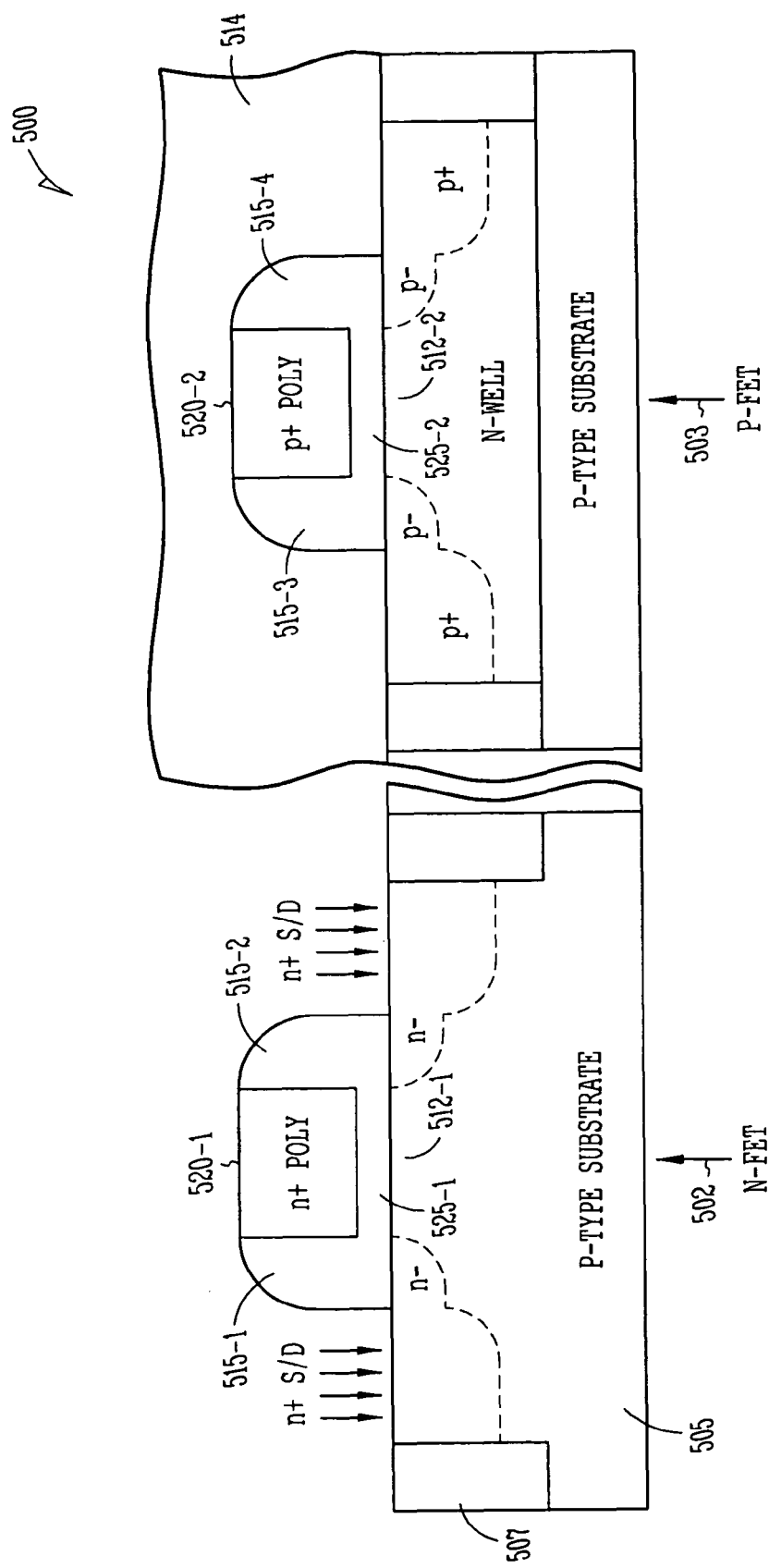

FIG. 5E shows a processing stage subsequent to the stage shown in FIG. 5D. The SiO⁺N on the P-FET may be selectively etched to form SiO⁺N spacers 515-3, 515-4 to provide the desired compressive strain on silicon channel 512-2 of P-FET 503. A bock mask 514 is formed on P-FET 503 to protect P-FET 503, when the SiO⁺N (or other insulator) is subsequently removed from the N-FET region. SiO⁺N may be selectively etched over the polysilicon gate of the N-FET region. A differential etch rate of 50:1 in a 7:1 BHF solution of FIG. 4 may be used. Other etch rates, etchants, or etching processes may be used. The source/drain regions of N-FET 502 may be implanted to form n⁺ regions, after which a resist strip process may be applied to remove resist 514. FIG. 5E shows the structure in the n⁺ S/D implant process.

Figure 5F:
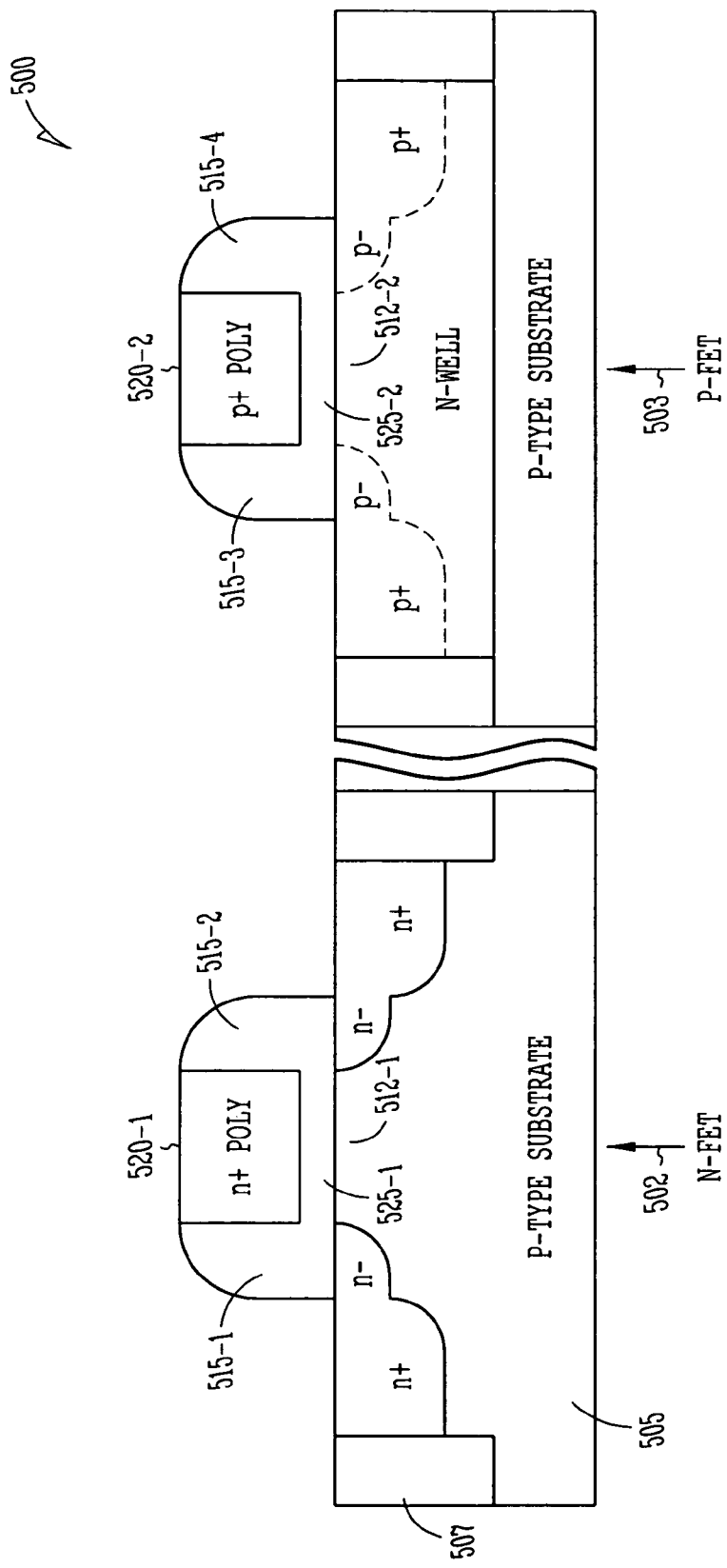

FIG. 5F shows structure 500 subsequent to the stage shown in FIG. 5E. FIG. 5F illustrates structure 500 after the block mask 514 over P-FET regions is removed and structure 500 is annealed for source/drain activation. Structure 500 has N-FET 502 with SiON⁺ spacers 515-1, 515-2 and silicon channel 512-1 in tension and P-FET 503 with SiO⁺N spacers 515-3, 515-4 and silicon channel 512-2 in compression. The SiON⁺ spacers 515-1, 515-2 and the SiO⁺N spacers 515-3, 515-4 regulate the strain/stress in their corresponding silicon channels to alter carrier mobility in these silicon channels. Tensile strain in a channel of p-type silicon material enhances the electron mobility in that channel. Compressive strain in a channel of n-type silicon material enhances the hole mobility in that channel.

FIGS. 5A-F illustrate a process providing mobility enhancement by forming appropriately strained silicon oxynitride spacers adjacent to the gate stacks in N-FET devices and P-FET devices in a process common to both devices. Various variations of the above process in other embodiments may be made to devices having different transistor structures than example embodiment of structure 500 illustrated in FIGS. 5A-F. Such a common process is not limited to N-FET devices and P-FET devices, but may be used to form other n-type and p-type devices having a silicon channel to provide enhanced mobility. Alternatively, N-FET devices and P-FET devices may be individually formed. Such a process may be performed as a CVD process. The CVD process may be a high temperature CVD process. Alternatively, other deposition techniques, such as ALD, may be employed with appropriate masking and etching process for these other techniques. A silicon oxynitride capping layer with or without silicon oxynitride spacers may also be used to control strain in a silicon channel to enhance carrier mobility in the silicon channel.

Figure 6A:
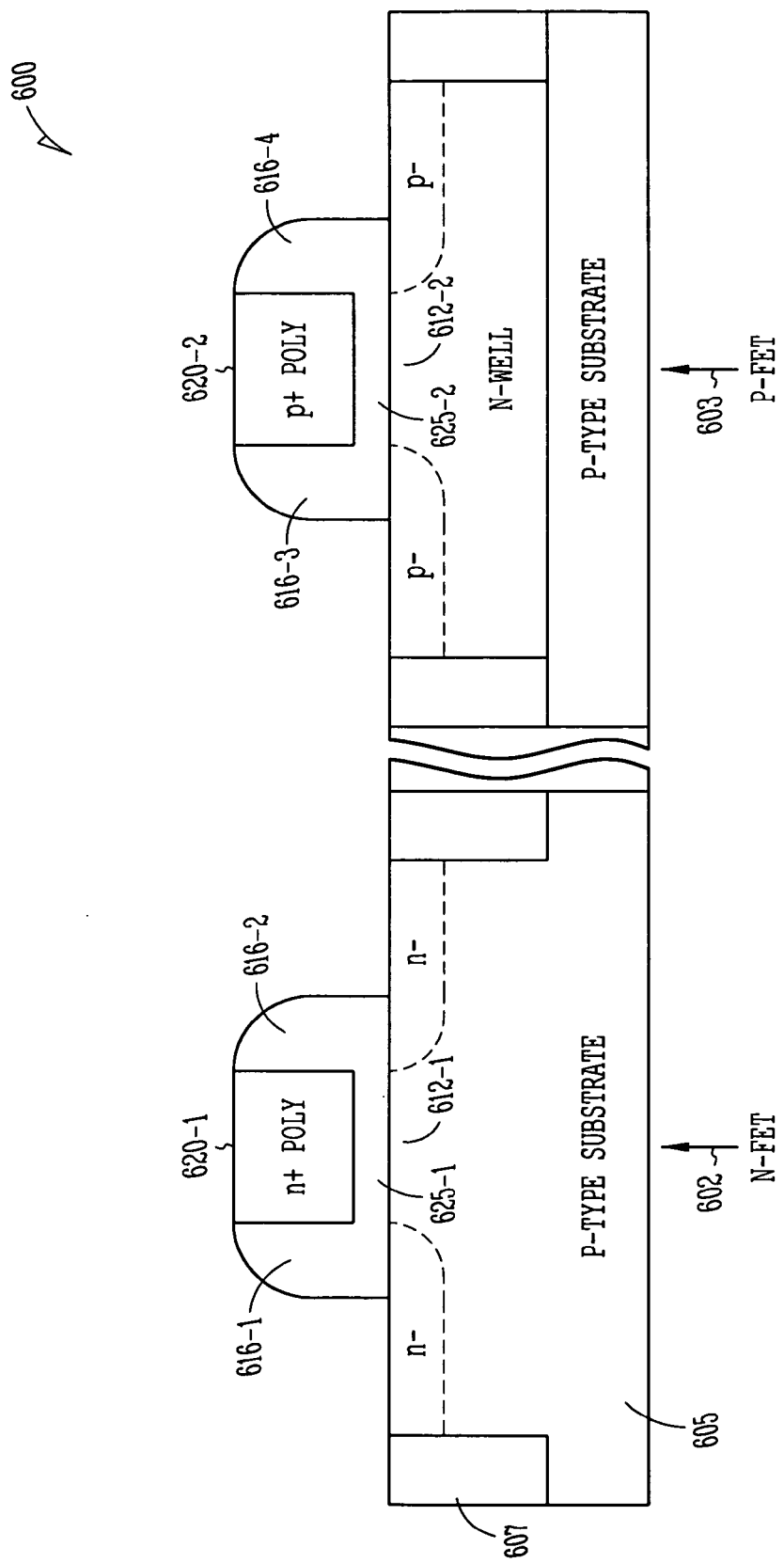
FIGS. 6A-E show features of an embodiment for forming a silicon oxynitride capping layer and silicon oxynitride spacers to control strain in silicon channels to enhance carrier mobility in these silicon channels.

FIGS. 6A-F show features of an embodiment for forming a silicon oxynitride capping layer and silicon oxynitride spacers to control strain in silicon channels to enhance carrier mobility in these silicon channels. FIG. 6A shows a stage of formation of spacers containing silicon oxynitride in a structure 600 having a N-FET transistor 602 with a silicon channel 612-1 and a P-FET transistor 603 with a silicon channel 612-2. N-FET 602 and P-FET 603 may be formed in a common fabrication of an integrated circuit. N-FET 602 and P-FET 603 may be transistors in a CMOS device. N-FET 602 and P-FET 603 may be individual transistors of different components on the same substrate 605. Alternatively, N-FET 602 and P-FET 603 may be fabricated separately. At the stage of processing illustrated in FIG. 6A, a STI 607 has been formed, polysilicon gates 620-1, 620-2 have been deposited on gate dielectrics 625-1, 625-2, respectively, with an associated gate etch, lightly doped drain (LDD) implants have been provided, and oxide spacers 616-1, 616-2, 616-3, and 616-4 have been formed in a common process by an oxide deposition followed by spacer etch. Polysilicon gate 620-1 may be a heavily doped n-type polysilicon gate for the N-FET. Polysilicon gate 620-2 may be a heavily doped p-type polysilicon gate for the P-FET. The material for the gates is not limited to polysilicon, the gate may be composed of any material that is suitable for use as a gate as is known by those skilled in such arts.

Figure 6B:
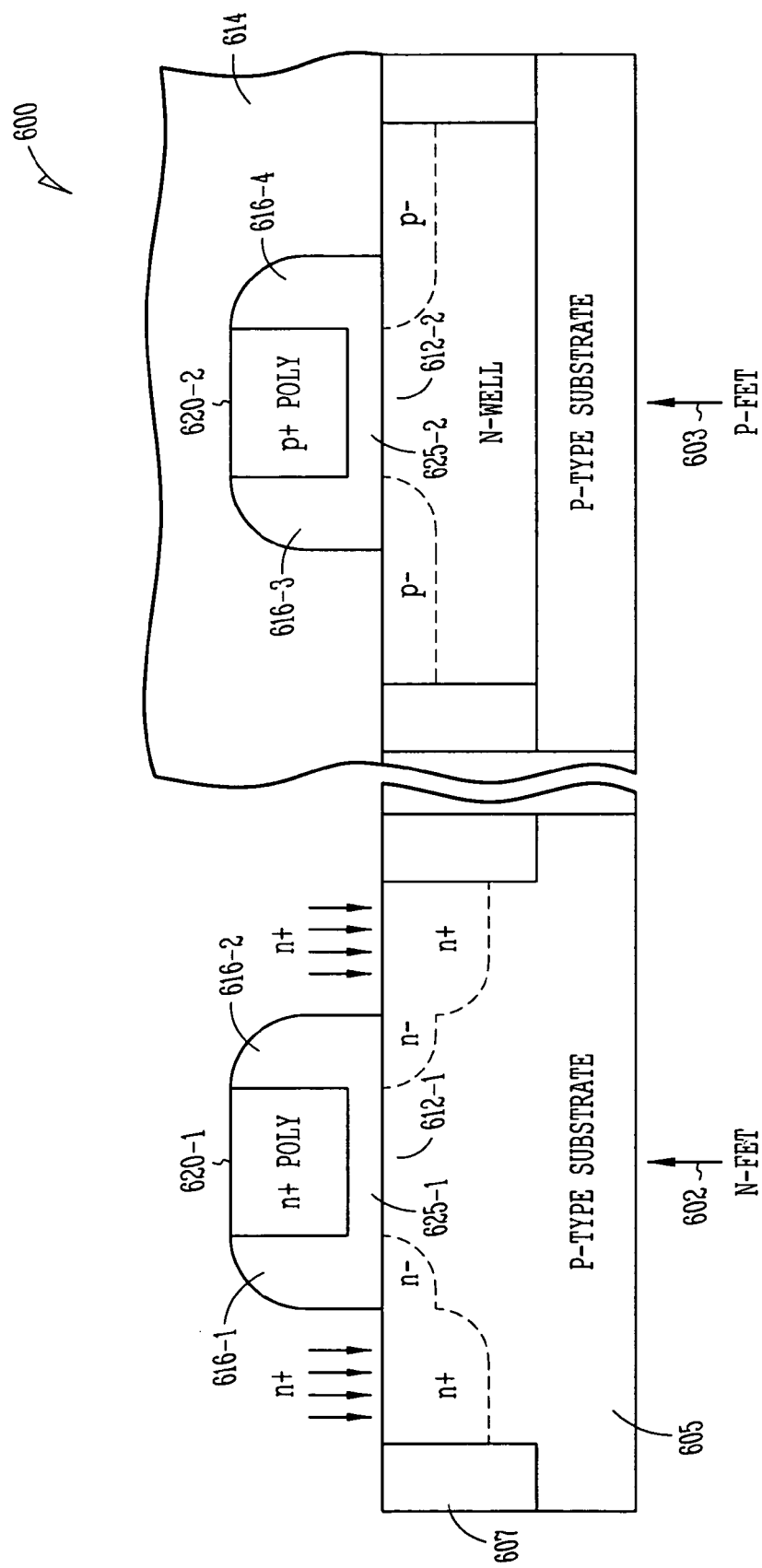

FIG. 6B shows a processing stage subsequent to the stage shown in FIG. 6A. A block mask 614 is formed over P-FET regions to protect the P-FET region. Ion implantation is conducted to provide n⁺ implants for the source/drain regions of N-FET 602.

Figure 6C:
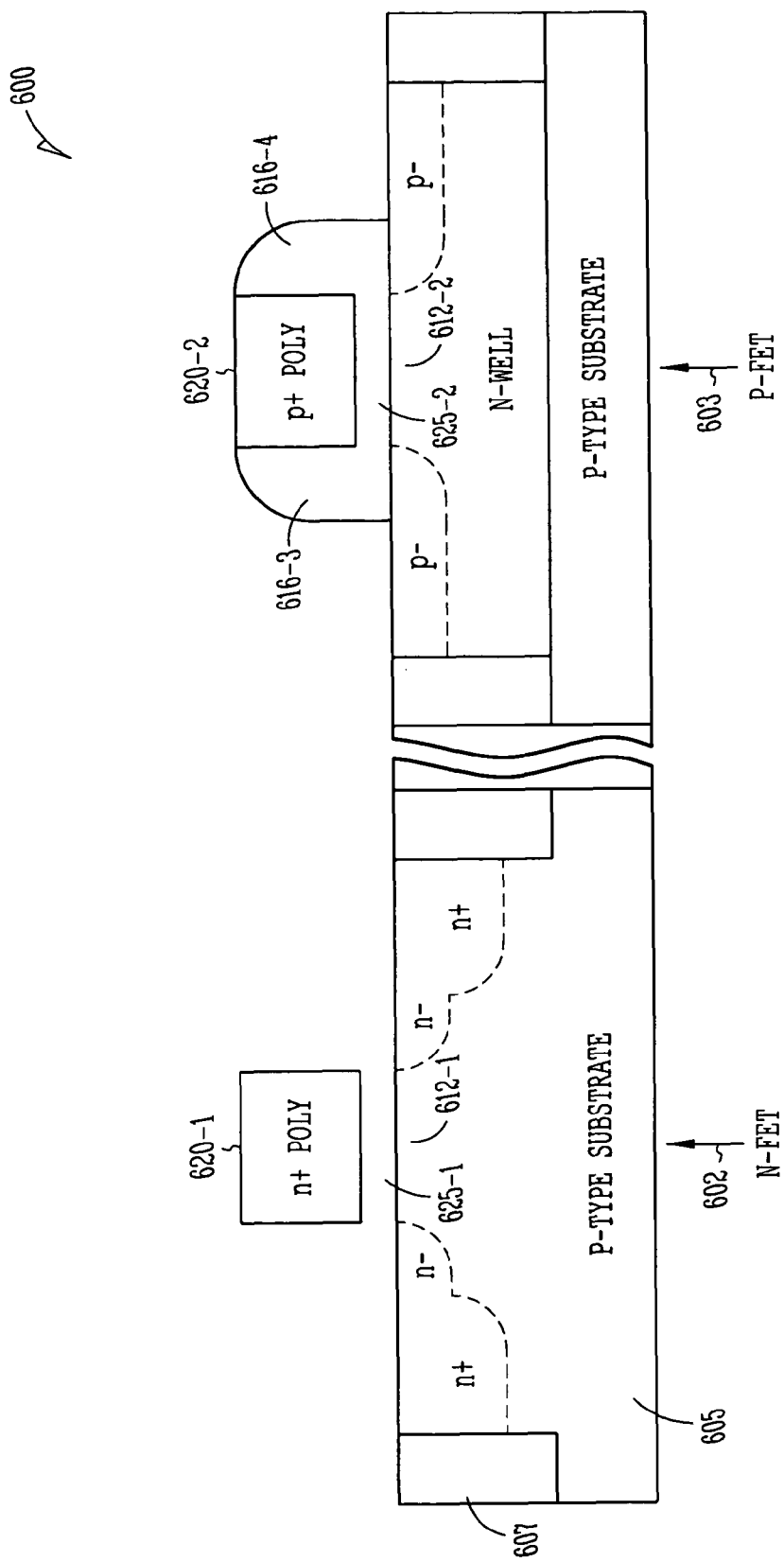

FIG. 6C shows a processing stage subsequent to the stage shown in FIG. 6B. Oxide spacers 616-1, 616-2 of N-FET 602 are selectively etched to remove oxide spacers 616-1, 616-2 from the N-FET region, with the etching process stopping at polysilicon gate 620-1 and substrate 605. Block resist mask 614 may then be stripped, resulting in structure 600 of FIG. 6C.

Figure 6D:
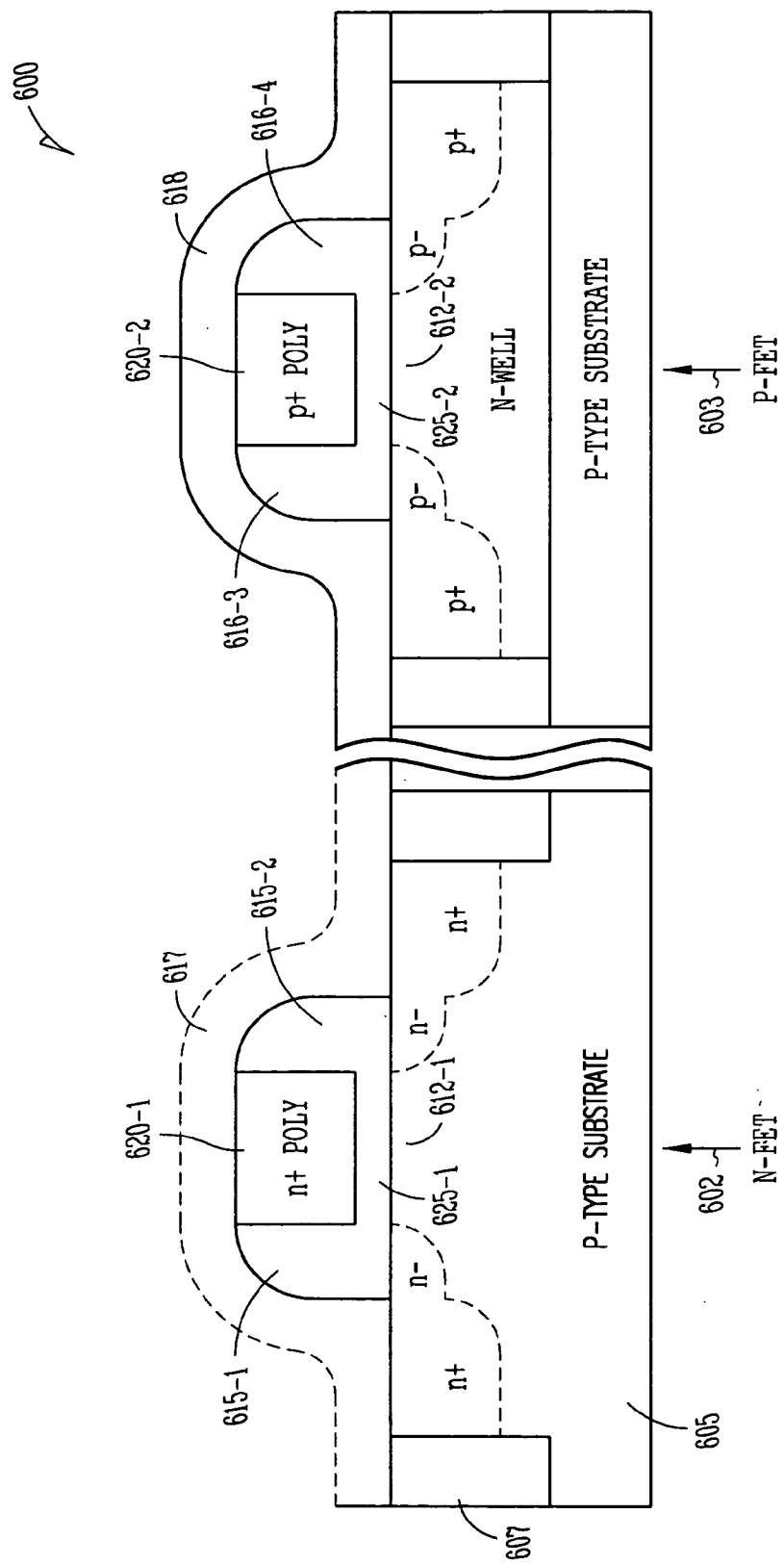

FIG. 6D shows a processing stage subsequent to the stage shown in FIG. 6C. A layer of stress-free silicon oxynitride is commonly deposited over N-FET 602 and P-FET 603. A stress-free silicon oxynitride having a refractive index of 1.6 may be provided in a CVD process using an oxygen flow rate of approximately 8 cc/min. A spacer etch follows to provide stress-free spacers 615-1, 615-2 for N-FET 602. An additional spacer on P-FET 603 may optionally remain. A block mask may be formed to protect the N-FET region and a p⁺ implantation of the source/drain regions of P-FET 603 may be performed, preceded by the removal of the stress-free oxynitride on P-FET 603. A capping layer of SiO⁺N is deposited. The SiO⁺N capping layer may be deposited in a common process to provide SiO⁺N layer 617 on N-FET 602 and SiO⁺N layer 618 on P-FET 603. In an embodiment, the SiO⁺N may have an index of refraction of 1.5. The capping layer deposition may be performed in a CVD process at high oxygen flow rate to form silicon oxynitride having a refractive index less than or equal to 1.5 to provide the targeted compressive strain in the P-FET device 603. An oxygen flow rate of equal to or greater than 16 cc/min may be used. At this stage as shown in FIG. 6D, structure 600 includes N-FET 602 with stress-free silicon oxynitride spacers 615-1, 615-2 and a SiO⁺N capping layer 617 that may be removed and P-FET 603 with silicon oxide spacers 616-3, 616-4 and a SiO⁺N capping layer 618.

Figure 6E:
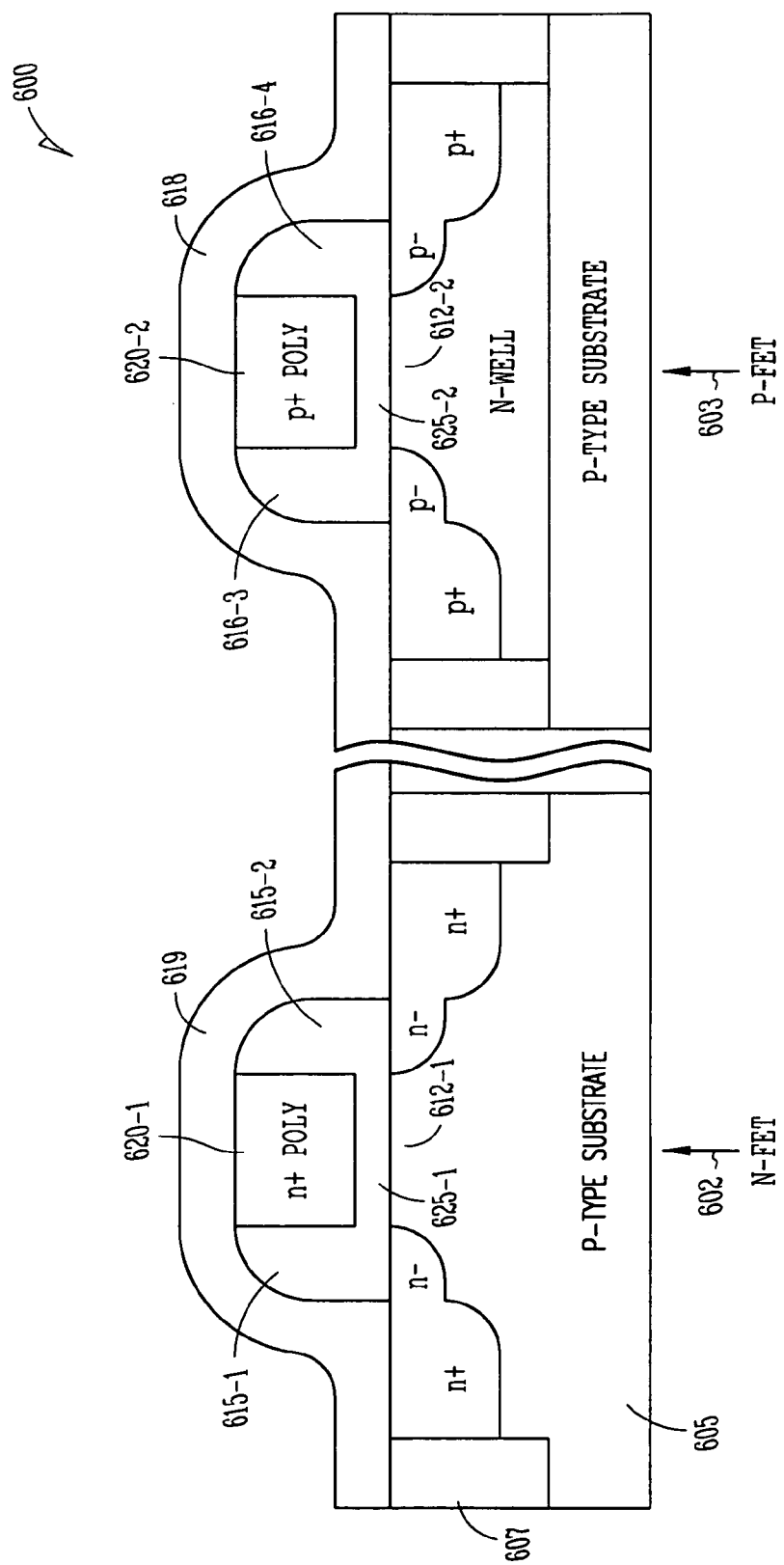

FIG. 6E shows a processing stage subsequent to the stage shown in FIG. 6D. Another block mask is formed over P-FET region to protect the P-FET region, while operating on the N-FET region. SiO⁺N capping layer 617 over the N-FET region may be removed by a selective etch. A second capping layer 619 of silicon oxynitride is deposited over N-FET 602. Capping layer 619 may be a SiON⁺ capping layer to provide the targeted tensile stress/strain for the N-FET device 602. SiON⁺ capping layer 619 may have a refractive index of approximately 1.9. SiON⁺ capping layer 619 may be deposited in a CVD process using an oxygen flow rate of about 2 cc/min. The block resist over the P-FET region may be removed and any overlayer on top of P-FET may or may not be removed, since its strain effect would be limited being far away from the P-FET channel region 612-2. Structure 600 may be annealed for source/drain activation. Structure 600 has N-FET 602 with SiON⁺ capping layer 619, stress-free silicon oxide spacers 615-1, 615-2 and silicon channel 612-1 in tension and P-FET 603 with SiO⁺N capping layer 618 and silicon channel 612-2 in compression. In an embodiment, SiON⁺ capping layer 619 may have a refractive index of about 1.9 and SiO⁺N may have a refractive index of about 1.5. The SiON⁺ capping layer 619 and stress-free silicon oxynitride spacers 615-1, 615-2 and the SiO⁺N capping layer 618 regulate the strain/stress in their corresponding silicon channels to alter carrier mobility in these silicon channels.

FIGS. 6A-E illustrate a process providing mobility enhancement by forming appropriately strained silicon oxynitride capping layers and spacers in N-FET devices and P-FET devices in a process common to both devices. Various variations of the above process in other embodiments may be made to devices having different transistor structures than example embodiment of structure 600 illustrated in FIGS. 6A-E. Such a common process is not limited to N-FET devices and P-FET devices, but may be used to form other n-type and p-type devices having a silicon channel to provide enhanced mobility. Alternatively, N-FET devices and P-FET devices may be individually formed. Such a process may be performed as a CVD process. The CVD process may be a high temperature CVD process. Alternatively, other deposition techniques, such as ALD, may be employed with appropriate masking and etching process for these other techniques.

In various embodiments, thermally and structurally stable silicon oxynitride may be realized. Such films may provide both tensile and compressive strains in underlying silicon layer for improved carrier mobility. In various embodiments, silicon oxynitride may be structured in a variety of semiconductor devices to control or regulate a silicon channel to improve the operational characteristics of these semiconductor devices, such channel current flow among other characteristics. Silicon oxynitride may be used as capping layers and spacers along with other mobility enhancing techniques in transistor-like devices, memories, and other integrated circuit devices used in electronic systems. The transistor-like devices may include a gate stack. Gate stack includes at least one gate and may include at least one dielectric layer.

Figure 7A:
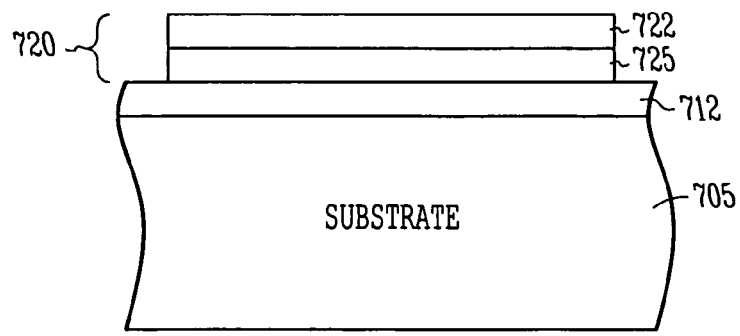
FIGS. 7A-C illustrate several embodiments of a gate stack that may be used in a semiconductor device in which silicon oxynitride is used to control stress/strain in a silicon channel to enhance carrier mobility in the silicon channel.
Figure 7B:
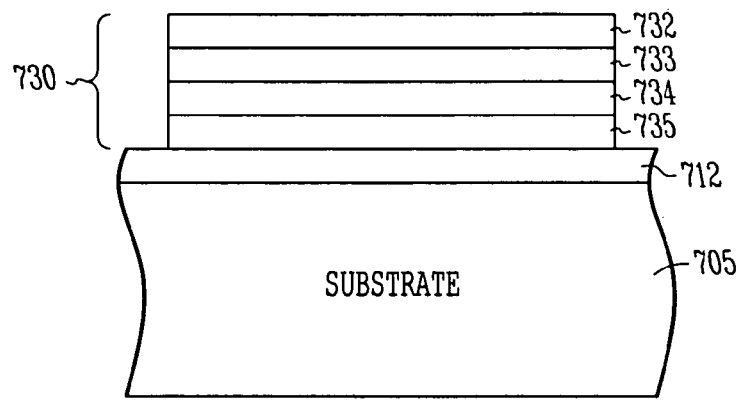
Figure 7C:
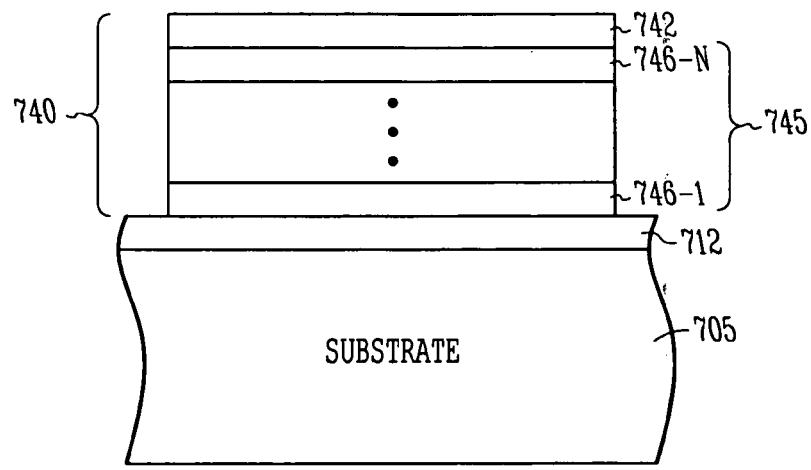

FIGS. 7A-C illustrate several embodiments of a gate stack that may be used in a semiconductor device in which silicon oxynitride is used to control stress/strain in a silicon channel to enhance carrier mobility in the silicon channel. FIG. 7A shows gate stack 720 disposed on a silicon channel 712 in a substrate 705. Gate stack 720 may be structured with a gate 722 disposed on a dielectric layer 725. Gate stack 720 may be used in various transistor and memory cells. FIG. 7B shows a configuration of gate stack 730 disposed on a silicon channel 712 in a substrate 705, in which gate stack 730 may be structured with a control gate 732 disposed on an intergate dielectric layer 733 that is disposed on a floating gate 734 that is disposed on a tunnel dielectric layer 735. Gate stack 730 may be used in various transistors, memory cells, and flash memories. FIG. 7C shows a configuration of gate stack 740 disposed on a silicon channel 712 in a substrate 705, in which gate stack 740 may be structured with a control gate 742 disposed on a dielectric stack 745. Dielectric stack 745 may be structured as multiple dielectric layers 746-1 ... 746-N, in which one of the dielectric layers is configured to store charge in a manner similar to a floating gate. Gate stack 730 may be used in various transistors, memory cells, and NROM memories. Gate stacks 720, 730, and 740 may be used to control current flow in silicon channel 712 and/or to control the on/off state of the semiconductor device in which the gate stack 720, 730, and 740 are disposed. Gate stacks are not limited to the configurations of FIGS. 7A-7C, but may be structured in other configurations to control current flow in a silicon channel and/or to control the on/off state of the semiconductor device in which the gate stack is disposed.

In FIGS. 7A-7C, gates 722, 732, 734, and 742 may be realized using polysilicon. The polysilicon may be n+-type polysilicon or p+-type polysilicon, depending on the application. Alternatively, gates 722, 732, 734, and 742 may be realized using other conductive materials such as metals, conductive metal nitrides, and conductive metal oxides. Dielectric materials for dielectric layers 725, 733, 735, and 745 may include, but are not limited to, silicon oxide, silicon nitride, silicon oxynitride, hafnium silicon oxynitride, insulating metal oxides, and insulating nitrides.

Figure 8:
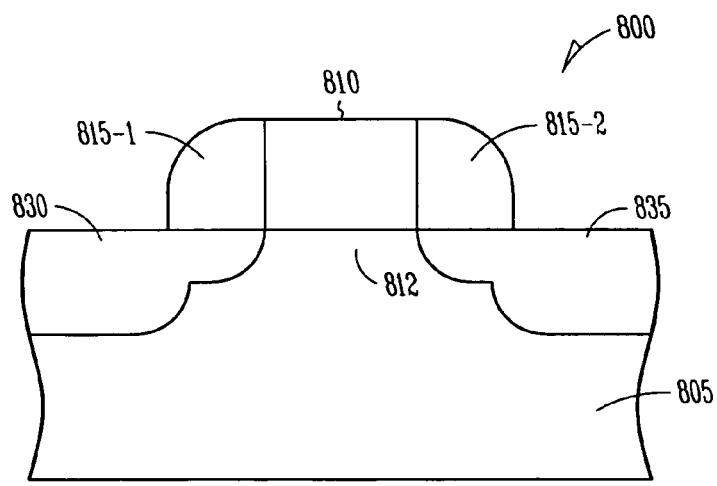
FIG. 8 shows an embodiment of a semiconductor transistor device having silicon oxynitride spacers adjacent a gate stack, where the silicon oxynitride spacers control the stress/strain in a silicon channel to enhance carrier mobility in the silicon channel.

FIG. 8 shows an embodiment of a semiconductor transistor device 800 having silicon oxynitride spacers adjacent a gate stack 810, where silicon oxynitride spacers 815-1, 815-2 control the stress/strain in a silicon channel 812 to enhance carrier mobility in silicon channel 812. Gate stack 810 may be used to control current flow in silicon channel 812 and/or to control the on/off state of the semiconductor device 800. Gate stack 810 may be realized as any one of gate stacks 720, 730, or 740 of FIGS. 7A-C or other configuration. Silicon channel 812 couples source/drain 830 to source/region 835 formed in substrate 805. Source/drains 830, 835 may be n-type or p-type and may have n⁻ and n⁺ regions and p⁻ and p⁺ regions, respectively, depending on the application. Substrate 805 may have a carrier type opposite the carrier type of source/drains 830,835 or, if substrate 805 may have the same carrier type as the carrier type of source/drains 830,835, then a well of opposite type may be structured in substrate 805 containing source/drains 830,835. Spacers 815-1, 815-2 may be structured to control the stress/strain in silicon channel 812 to be a compressive stress/strain to improve hole mobility in silicon channel 812. Spacers 815-1, 815-2 may be structured to control the stress/strain in silicon channel 812 to be a tensile stress/strain to improve electron mobility in silicon channel 812. Spacers 815-1, 815-2 may include material in addition to silicon oxynitride to control the stress/strain in silicon channel 812.

Figure 9:
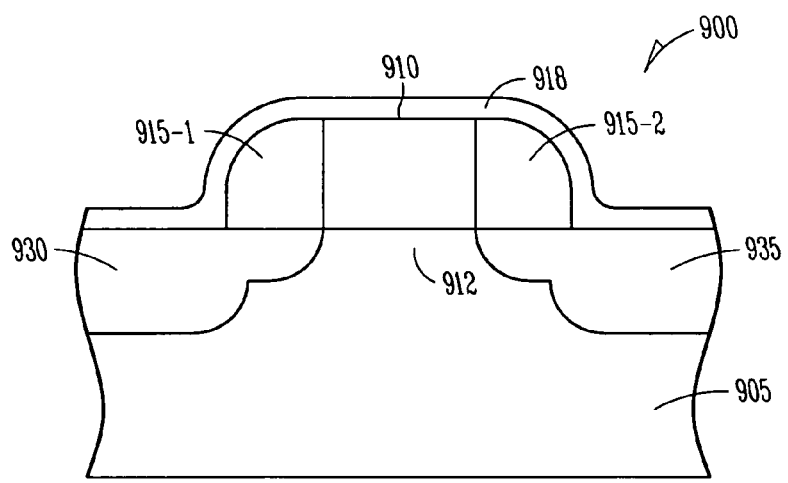
FIG. 9 shows an embodiment of a semiconductor transistor device having a silicon oxynitride capping layer, where the silicon oxynitride capping layer regulates the stress/strain in a silicon channel to enhance carrier mobility in the silicon channel.

FIG. 9 shows an embodiment of a semiconductor transistor device 900 having silicon oxynitride capping layer 918, where silicon oxynitride capping layer controls the stress/strain in a silicon channel 912 to enhance carrier mobility in silicon channel 912. Device 900 includes spacers 915-1, 915-2 adjacent a gate stack 910, which may be used in conjunction with silicon oxynitride capping layer 918. Gate stack 910 may be used to control current flow in silicon channel 912 and/or to control the on/off state of the semiconductor device 900. Gate stack 910 may be realized as any one of gate stacks 720, 730, or 740 of FIGS. 7A-C or other configuration. Silicon channel 912 couples source/drain 930 to source/region 935 formed in substrate 905. Source/drains 930, 935 may be n-type or p-type and may have $n^-$ and $n^+$ regions and $p^-$ and $p^+$ regions, respectively, depending on the application. Substrate 905 may have a carrier type opposite the carrier type of source/drains 930,935 or, if substrate 905 may have the same carrier type as the carrier type of source/drains 930,935, then a well of opposite type may be structured in substrate 905 containing source/drains 930,935. Silicon oxynitride capping layer 918 may be structured to control the stress/strain in silicon channel 912 to be a compressive stress/strain to improve hole mobility in silicon channel 912. Silicon oxynitride capping layer 918 may be structured to control the stress/strain in silicon channel 912 to be a tensile stress/strain to improve electron mobility in silicon channel 912. For silicon channel 912, in which the carriers under operation are holes, spacers 915-1, 915-2 may be silicon oxide in tension under silicon oxynitride capping layer 918 in tension to regulate compressive stress/strain in silicon channel 912. Materials in tension other than silicon oxide, such as silicon oxynitride in tension, may be used in spacers 915-1, 915-2 in conjunction with silicon oxynitride capping layer 918. For silicon channel 912, in which the carriers under operation are electrons, spacers 915-1, 915-2 may be stress-free silicon oxynitride under silicon oxynitride capping layer 918 in compression to regulate tensile stress/strain in silicon channel 912. Silicon oxynitride capping layers and silicon oxynitride spacers may be used with other techniques to regulate stress/strain in a silicon channel to enhance carrier mobility in the silicon channel.

Figure 10:
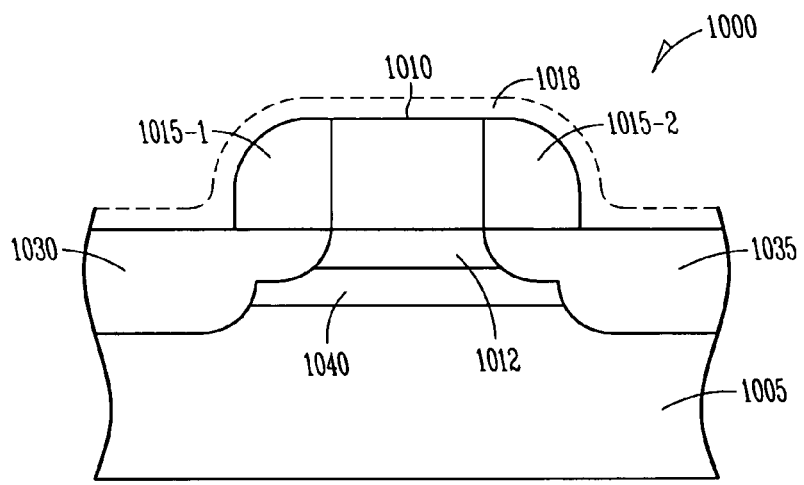
FIG. 10 shows an embodiment of a semiconductor transistor device having a silicon channel disposed on a layer structured in conjunction with silicon oxynitride regions to regulate the stress/strain in the silicon channel to enhance carrier mobility in the silicon channel.

FIG. 10 shows an embodiment of a semiconductor transistor device 1000 having a silicon channel 1012 disposed on a layer 1040 structured in conjunction with silicon oxynitride regions to regulate the stress/strain in silicon channel 1012 to enhance carrier mobility in silicon channel 1012. In an embodiment, semiconductor transistor device 1000 includes silicon oxynitride spacers 1015-1, 1015-2 adjacent a gate stack 1010, where silicon oxynitride spacers 1015-1, 1015-2 control the stress/strain in silicon channel 1012. Silicon channel 1012 may be disposed between source/drain regions 1030,1035 and on layer 1040 of a material different from silicon and different from substrate 1005 on which layer 1040 is formed. Layer 1040 may include silicon germanium, SiGe, which may be structured such that layer 1040 may be engineered with silicon oxynitride spacers 1015-1, 1015-2 to provide the desired stress/strain in silicon channel 1012. A SiGe layer may be strained or unstrained dependent on the application of layer 1040 containing SiGe with silicon oxynitride spacers 1015-1, 1015-2. Layer 1040 may include silicon carbon, SiC, which may be structured such that layer 1040 may be engineered with silicon oxynitride spacers 1015-1, 1015-2 to provide the desired stress/strain in silicon channel 1012. A SiC layer may be strained or unstrained dependent on the application of layer 1040 containing SiC with silicon oxynitride spacers 1015-1, 1015-2. Alternatively, a silicon oxynitride capping layer 1018 may be used as the primary technique to control stress/strain in silicon channel 1012.

Figure 11A:
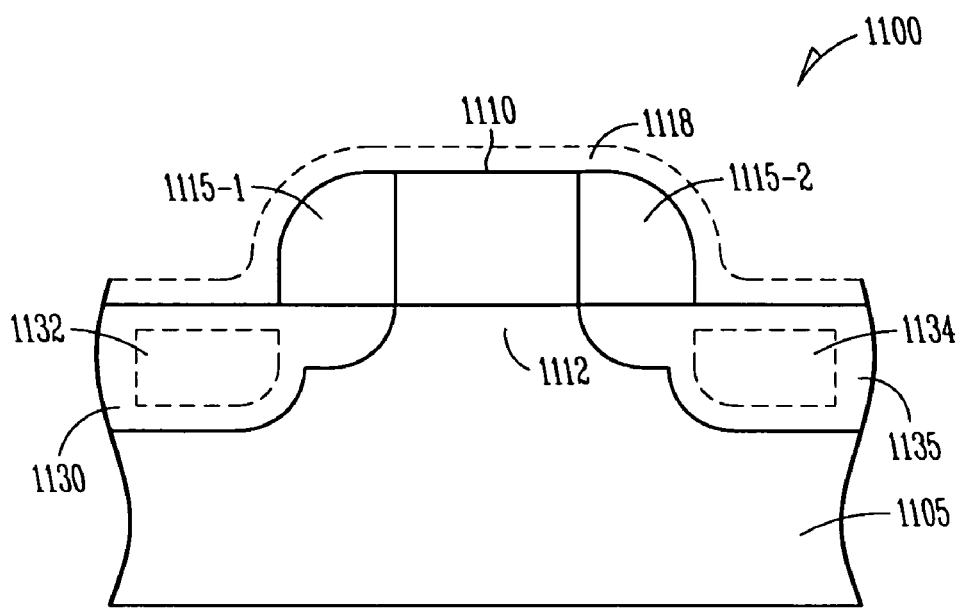
FIGS. 11A-B show embodiments of semiconductor transistor devices having a silicon channel disposed between source/drains, where each source/drain contains a region structured in conjunction with silicon oxynitride regions to regulate the stress/strain in the silicon channel to enhance carrier mobility in the silicon channel.
Figure 11B:
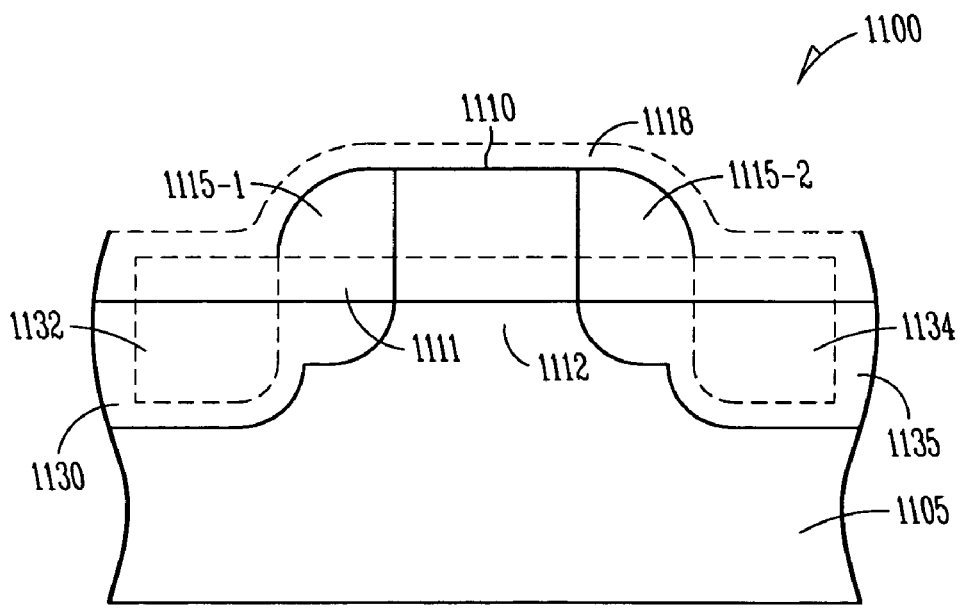

FIGS. 11A-B show embodiments of a semiconductor transistor device 1100 having a silicon channel 1112 disposed between source/drains regions 1130, 1135, where each source/drain region 1130 and 1135 contains a region 1132 and 1134, respectively, structured in conjunction with silicon oxynitride regions to regulate the stress/strain in the silicon channel to enhance carrier mobility in the silicon channel. FIG. 11A shows an embodiment of semiconductor transistor device 1100 having silicon oxynitride spacers 1115-1, 1115-2 adjacent a gate stack 1110, where silicon oxynitride spacers 1115-1, 1115-2 control the stress/strain in silicon channel 1112. Alternatively, a silicon oxynitride capping layer 1118 may be used as the primary technique to control stress/strain in silicon channel 1112. Device 1100 includes a gate stack 1110 on silicon channel 1112 with spacers 1115-1, 1115-2 adjacent gate stack 1110. Source/drain regions 1130, 1135 may include regions 1132, 1134, respectively, having material different from channel 1112 and substrate 1105. Regions 1132, 1134 may be engineered with silicon oxynitride spacers 1115-1, 1115-2 and/or silicon oxynitride capping layer 1118 to provide the desired stress/strain in silicon channel 1112. Regions 1132, 1134 may include SiGe and substrate 1105 may be a silicon substrate. The SiGe may be strained or unstrained, which is dependent on the application of regions 1132, 1134 containing SiGe with silicon oxynitride capping layer 1118 and/or silicon oxynitride spacers 1115-1, 1115-2. FIG. 1B shows regions 1132, 1134 raised above the surface of silicon channel 1112. In various applications, a gate insulator 1111 of gate stack 1110 may optionally extend from gate stack 1110 and be disposed over portions of source/regions 1130, 1135 with spacers 1115-1, 1115-2 disposed on gate insulator 1111 forming the gate insulator or portions of gate insulator in gate stack 1110.

Various combinations of silicon oxynitride capping layers, silicon oxynitride spacers, and other techniques may be combined to control or regulate the stress/strain in silicon channels to enhance carrier mobility for a variety of semiconductor devices and systems. In various embodiments, process techniques may be used to provide stable compressive stress/strain for p-type devices, such as but not limited to PMOS devices, and tensile stress/strain for n-type devices, such as but not limited to NMOS, not only during process integration but also during the application life time of the device. Such techniques using silicon oxynitride capping layer and/or silicon oxynitride spacers may be used in CMOS microprocessor technology. Such silicon oxynitride capping layers and/or silicon oxynitride spacers may be implemented into memory devices and electronic systems including information handling devices. Further, embodiments of electronic devices and electronic apparatus may be realized as integrated circuits. Embodiments of information handling devices may include wireless systems, telecommunication systems, and computers.

Figure 12:
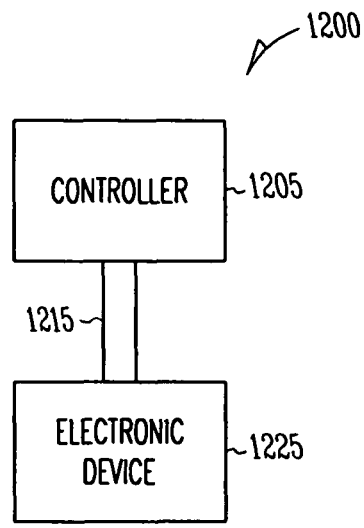
FIG. 12 is a simplified diagram for an embodiment of a controller coupled to an electronic device having a semiconductor device that includes a silicon channel to conduct current, in which strain in the silicon channel is controlled by a silicon oxynitride layer on the semiconductor device.

FIG. 12 illustrates a block diagram of an embodiment for an electronic system 1200 including one or more devices having a silicon oxynitride capping layer and/or silicon oxynitride spacers to control stress/strain in a silicon channel to modify mobility of carriers in the silicon channel. Electronic system 1200 includes a controller 1205, a bus 1215, and an electronic device 1225, where bus 1215 provides electrical conductivity between controller 1205 and electronic device 1225. In various embodiments, controller 1205 may include an embodiment of a silicon oxynitride capping layer and/or silicon oxynitride spacers to control stress/strain in a silicon channel to modify mobility of carriers in the silicon channel. In an embodiment, controller 1205 may be a processor. In various embodiments, electronic device 1225 may include an embodiment of a silicon oxynitride capping layer and/or silicon oxynitride spacers to control stress/strain in a silicon channel to modify mobility of carriers in the silicon channel. In various embodiments, controller 1205 and electronic device 1225 may include embodiments of a silicon oxynitride capping layer and/or silicon oxynitride spacers to control stress/strain in a silicon channel to modify mobility of carriers in the silicon channel. Electronic system 1200 may include, but is not limited to, fiber optic systems, electro-optic systems, and information handling systems such as wireless systems, telecommunication systems, and computers.

Figure 13:
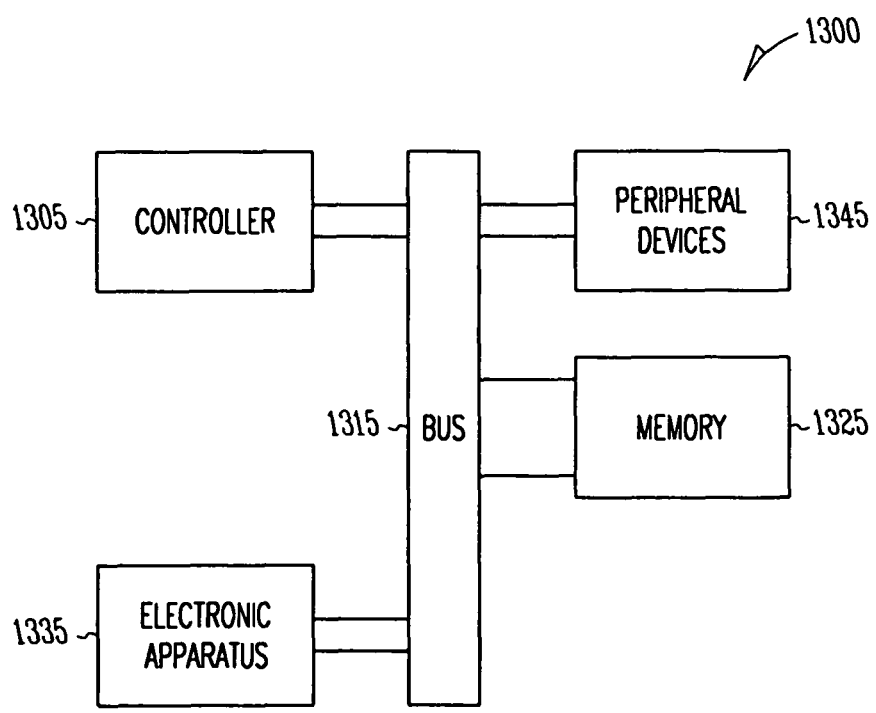
FIG. 13 illustrates a diagram for an embodiment of an electronic system having devices with a having a semiconductor device that includes a silicon channel to conduct current, in which strain in the silicon channel is controlled by a silicon oxynitride layer on the semiconductor device.

FIG. 13 depicts a block diagram of an embodiment of a system 1300 including an apparatus having a silicon oxynitride capping layer and/or silicon oxynitride spacers to control stress/strain in a silicon channel to modify mobility of carriers in the silicon channel. Controller 1305 may include a silicon oxynitride capping layer and/or silicon oxynitride spacers to control stress/strain in a silicon channel to modify mobility of carriers in the silicon channel. Memory 1325 may include a silicon oxynitride capping layer and/or silicon oxynitride spacers to control stress/strain in a silicon channel to modify mobility of carriers in the silicon channel. Controller 1305 and memory 1325 may each include a silicon oxynitride capping layer and/or silicon oxynitride spacers to control stress/strain in a silicon channel to modify mobility of carriers in the silicon channel. System 1300 also includes an electronic apparatus 1335 and a bus 1315, where bus 1315 provides electrical conductivity between controller 1305 and electronic apparatus 1335, and between controller 1305 and memory 1325. Bus 1315 may include an address bus, a data bus, and a control bus, each independently configured. Alternatively, bus 1315 may use common conductive lines for providing one or more of address, data, or control, the use of which is regulated by controller 1305. In an embodiment, electronic apparatus 1335 may be additional memory configured in a manner similar to memory 1325. An embodiment may include an additional peripheral device or devices 1345 coupled to bus 1315. In an embodiment, controller 1305 is a processor. One or more of controller 1305, memory 1325, bus 1315, electronic apparatus 1335, or peripheral devices 1345 may include an embodiment of a silicon oxynitride capping layer and/or silicon oxynitride spacers to control stress/strain in a silicon channel to modify mobility of carriers in the silicon channel. System 1300 may include, but is not limited to, information handling devices, telecommunication systems, and computers.

Peripheral devices 1345 may include displays, additional storage memory, or other control devices that may operate in conjunction with controller 1305. Alternatively, peripheral devices 1345 may include displays, additional storage memory, or other control devices that may operate in conjunction with memory 1325, or controller 1305 and memory 1325.

Memory 1325 may be realized as a memory device containing a silicon oxynitride capping layer and/or silicon oxynitride spacers to control stress/strain in a silicon channel to modify mobility of carriers in the silicon channel. A silicon oxynitride capping layer and/or silicon oxynitride spacers to control stress/strain in a silicon channel may be formed in a memory cell of a memory array. Such a structure may be formed in a transistor in a memory cell of a memory array. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as other emerging DRAM technologies.

In various embodiments, high temperature CVD silicon oxynitride layers provide structures to regulate the stress/strain in an underlying channel. Due to the nature of the CVD silicon oxynitride layer as a result of the high temperature processing, such structures have greater stability in maintaining the desired structure than structures in which silicon oxynitride layers are fabricated by other means. High temperature processing of the CVD silicon oxynitride films provides for controlling the hydrogen content in devices containing these films. High temperature CVD silicon oxynitride films maintain compositional and structural stability when subjected to subsequent thermal and processing cycles to complete the devices in which they are formed. In addition, high temperature CVD silicon oxynitride films maintain compositional and structural stability during the life-time of application of the devices containing such these films.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon reviewing the above description.

What is claimed is:

1. A method comprising:
    forming a strained silicon oxynitride layer on a semiconductor device, the semiconductor device having a silicon channel to conduct current, the strained silicon oxynitride layer contacting a stress-free silicon oxynitride region, wherein the strained silicon oxynitride layer is formed by high temperature chemical vapor deposition including controlling flow of oxygen during the high temperature chemical vapor deposition to match a selected magnitude and polarity of strain for the strained silicon oxynitride layer and structuring both the strained silicon oxynitride layer and the stress-free silicon oxynitride region to control strain in the silicon channel.

2. The method of claim 1, wherein structuring the silicon oxynitride layer includes forming the silicon oxynitride layer as an oxygen-rich silicon oxynitride layer to provide compressive strain to the silicon channel.

3. The method of claim 2, wherein forming the silicon oxynitride layer as an oxygen-rich silicon oxynitride layer includes forming the silicon oxynitride layer having a ratio of atomic nitrogen to the sum of atomic nitrogen and atomic oxygen less than 0.15.

4. The method of claim 1, wherein structuring the silicon oxynitride layer includes forming the silicon oxynitride layer as a nitrogen-rich silicon oxynitride layer to provide tensile strain to the silicon channel.

5. The method of claim 1, wherein forming the silicon oxynitride layer by high temperature chemical vapor deposition includes forming the silicon oxynitride layer by chemical vapor deposition at about 900° C.

6. The method of claim 1, wherein forming a silicon oxynitride layer on a semiconductor device includes forming the silicon oxynitride layer on a n-channel field effect transistor.

7. The method of claim 1, wherein forming a silicon oxynitride layer on a semiconductor device includes forming the silicon oxynitride layer on a p-channel field effect transistor.

8. A method comprising:
forming a strained silicon oxynitride layer contacting a stress-free silicon oxynitride region on a semiconductor-based transistor, the semiconductor-based transistor having a silicon channel between a drain and a source, including:
depositing the strained silicon oxynitride layer by chemical vapor deposition at a temperature greater than 750° C.;
controlling flow of oxygen during the chemical vapor deposition to match a selected magnitude and polarity of strain for the strained silicon oxynitride layer and structuring the strained silicon oxynitride layer and the stress-free silicon oxynitride region to control strain in the silicon channel.

9. The method of claim 8, wherein structuring the silicon oxynitride layer includes forming the silicon oxynitride layer as an oxygen-rich silicon oxynitride layer to provide compressive strain to the silicon channel.

10. The method of claim 9, wherein forming the silicon oxynitride layer as an oxygen-rich silicon oxynitride layer includes forming the silicon oxynitride layer having a ratio of atomic nitrogen to the sum of atomic nitrogen and atomic oxygen less than 0.15.

11. The method of claim 8, wherein structuring the silicon oxynitride layer includes forming the silicon oxynitride layer as a nitrogen-rich silicon oxynitride layer to provide tensile strain to the silicon channel.

12. The method of claim 8, wherein structuring the silicon oxynitride layer includes forming the silicon oxynitride layer having a ratio of atomic nitrogen to the sum of atomic nitrogen and atomic oxygen between 0.3 and 1.0.

13. The method of claim 8, wherein forming a silicon oxynitride layer on a transistor includes forming a silicon oxynitride layer on an NMOS transistor to configure the silicon channel as a tensile strained silicon channel.

14. The method of claim 13, wherein forming a silicon oxynitride layer on an NMOS transistor includes forming the NMOS transistor as a transistor of a memory device.

15. The method of claim 14, wherein forming the NMOS transistor as a transistor of a memory device includes forming the NMOS transistor in a flash memory device.

16. The method of claim 8, wherein forming a silicon oxynitride layer on a transistor includes forming a silicon oxynitride layer to configure the silicon channel as a tensile strained silicon channel in a NROM memory device.

17. The method of claim 8, forming a silicon oxynitride layer on a transistor includes forming a silicon oxynitride layer on an NMOS transistor of a CMOS structure to configure the silicon channel as a tensile strained silicon channel in a CMOS logic device.

18. The method of claim 8, wherein forming a silicon oxynitride layer on a transistor includes forming a silicon oxynitride layer on an PMOS transistor to configure the silicon channel as a compressive strained silicon channel.

19. The method of claim 18, wherein forming a silicon oxynitride layer on a PMOS transistor includes forming the PMOS transistor as a transistor of a memory device.

20. The method of claim 8, forming a silicon oxynitride layer on a transistor includes forming a silicon oxynitride layer on an PMOS transistor of a CMOS structure to configure the silicon channel as a compressive strained silicon channel in a CMOS logic device.

21. The method of claim 8, wherein the method includes forming SiGe regions in both the source and the drain.

22. The method of claim 8, wherein the method includes forming a SiGe layer between the source and the drain, the silicon channel being disposed on the SiGe layer.

23. The method of claim 8, wherein the method includes forming the source and the drain on a silicon substrate.

24. The method of claim 8, wherein the method includes forming the source and the drain on a SiGe substrate.

25. The method of claim 8, wherein depositing the silicon oxynitride layer by chemical vapor deposition includes depositing the silicon oxynitride layer at about 900° C.

26. A method comprising:
forming an array of memory cells; and
forming a strained silicon oxynitride layer by high temperature chemical vapor deposition on a transistor disposed in a memory cell, the strained silicon oxynitride layer contacting a stress-free silicon oxynitride region;
controlling flow of oxygen during the high temperature chemical vapor deposition to match a selected magnitude and polarity of strain for the strained silicon oxynitride layer and structuring both the strained silicon oxynitride layer and the stress-free silicon oxynitride region to control strain in a silicon channel of the transistor.

27. The method of claim 26, wherein structuring the silicon oxynitride layer includes forming the silicon oxynitride layer as an oxygen-rich silicon oxynitride layer to provide compressive strain to the silicon channel.

28. The method of claim 27, wherein forming the silicon oxynitride layer as an oxygen-rich silicon oxynitride layer includes forming the silicon oxynitride layer having a ratio of atomic nitrogen to the sum of atomic nitrogen and atomic oxygen less than 0.15.

29. The method of claim 26, wherein structuring the silicon oxynitride layer includes forming the silicon oxynitride layer as a nitrogen-rich silicon oxynitride layer to provide tensile strain to the silicon channel.

30. The method of claim 26, wherein forming a silicon oxynitride layer on a transistor includes:
forming a first silicon oxynitride layer as part of a first spacer, the first spacer disposed adjacent a gate stack formed on the silicon channel and on a portion of the drain; and
forming a second silicon oxynitride layer as part of a second spacer, the second spacer disposed adjacent the gate stack and on a portion of the source, the first and second silicon oxynitride layers structured to control strain in the silicon channel.

31. The method of claim 30, wherein the method includes forming the first spacer substantially as the first silicon oxynitride layer and forming the second spacer substantially as the second silicon oxynitride layer.

32. The method of claim 26, wherein forming a silicon oxynitride layer on a transistor includes:
forming a first spacer adjacent a gate stack disposed on the silicon channel and on portion of the drain;
forming a second spacer adjacent the gate stack and on portion of the source; and
forming a capping layer on the gate stack, the first and second spacers, the drain, and the source, the capping layer containing the silicon oxynitride layer structured to control strain in the silicon channel.

33. The method of claim 32, wherein forming a first spacer and forming a second spacer includes forming stress-free silicon oxynitride as the first spacer by high temperature chemical vapor deposition and forming stress-free silicon oxynitride as the second spacer by high temperature chemical vapor deposition.

34. The method of claim 32, wherein forming a first spacer and forming a second spacer includes forming silicon oxide in tension as the first spacer and forming silicon oxide in tension as the second spacer.

35. The method of claim 32, wherein forming a first spacer includes forming silicon oxynitride as the first spacer by high temperature chemical vapor deposition and forming a second spacer includes forming a silicon oxynitride as the second spacer by high temperature chemical vapor deposition, the silicon oxynitride for both the first spacer and the second spacer structured to control strain in the silicon channel in conjunction with the capping layer.

36. A method comprising:
providing a processor; and
coupling an integrated circuit to the processor, the integrated circuit having a strained silicon oxynitride layer formed on a semiconductor device by high temperature chemical vapor deposition, the strained silicon oxynitride layer contacting a stress-free silicon oxynitride region;
controlling flow of oxygen during the high temperature chemical vapor deposition to match a selected magnitude and polarity of strain for the strained silicon oxynitride layer, the semiconductor device having a silicon channel to conduct current and having a structure formed with the strained silicon oxynitride layer and the stress-free silicon oxynitride region arranged to control strain in the silicon channel.

37. The method of claim 36, wherein structuring the silicon oxynitride layer includes forming the silicon oxynitride layer as an oxygen-rich silicon oxynitride layer to provide compressive strain to the silicon channel.

38. The method of claim 37, wherein forming the silicon oxynitride layer as an oxygen-rich silicon oxynitride layer includes forming the silicon oxynitride layer having a ratio of atomic nitrogen to the sum of atomic nitrogen and atomic oxygen less than 0.15.

39. The method of claim 36, wherein structuring the silicon oxynitride layer includes forming the silicon oxynitride layer as a nitrogen-rich silicon oxynitride layer to provide tensile strain to the silicon channel.

40. The method of claim 36, wherein forming a silicon oxynitride layer on a semiconductor device includes forming the silicon oxynitride layer on a n-channel field effect transistor.

41. The method of claim 36, wherein forming a silicon oxynitride layer on a semiconductor device includes forming the silicon oxynitride layer on a p-channel field effect transistor.

42. The method of claim 36, wherein coupling an integrated circuit to the processor includes coupling a memory to the processor, the memory having the silicon oxynitride layer formed on a transistor.

43. An electronic device comprising:
a substrate;
a semiconductor device disposed on the substrate, the semiconductor device having a silicon channel to conduct current;
a strained silicon oxynitride layer on the semiconductor device, the strained silicon oxynitride layer contacting a stress-free silicon oxynitride region, wherein both the strained silicon oxynitride layer and the stress-free silicon oxynitride region are structured to control strain in the silicon channel.

44. The electronic device of claim 43, wherein the high temperature chemical vapor deposited silicon oxynitride layer includes an oxygen-rich silicon oxynitride layer to provide compressive strain to the silicon channel.

45. The electronic device of claim 44, wherein the oxygen-rich silicon oxynitride layer has a ratio of atomic nitrogen to the sum of atomic nitrogen and atomic oxygen less than 0.15.

46. The electronic device of claim 43, wherein the high temperature chemical vapor deposited silicon oxynitride layer includes a nitrogen-rich silicon oxynitride layer to provide tensile strain to the silicon channel.

47. The electronic device of claim 43, wherein the semiconductor device includes a n-channel field effect transistor.

48. The electronic device of claim 43, wherein the semiconductor device includes a p-channel field effect transistor.

49. The electronic device of claim 43, wherein the semiconductor device includes an NMOS transistor with the high temperature chemical vapor deposited silicon oxynitride layer configured on the NMOS transistor to provide a tensile strained silicon channel.

50. The electronic device of claim 49, wherein the NMOS transistor is disposed on the substrate as a transistor of a memory device.

51. The electronic device of claim 49, wherein the NMOS transistor is disposed on the substrate as a transistor of a flash memory device.

52. The electronic device of claim 43, wherein the semiconductor device includes the high temperature chemical vapor deposited silicon oxynitride layer configured to provide a tensile strained silicon channel in a NROM memory device.

53. The electronic device of claim 43, wherein the semiconductor device includes an NMOS transistor of a CMOS structure with the high temperature chemical vapor deposited silicon oxynitride layer configured on the NMOS transistor to provide a tensile strained silicon channel in a CMOS logic device.

54. The electronic device of claim 43, wherein the semiconductor device includes an PMOS transistor with the high temperature chemical vapor deposited silicon oxynitride layer configured on the PMOS transistor to provide a compressive strained silicon channel.

55. The electronic device of claim 54, wherein the PMOS transistor is disposed on the substrate as a transistor of a memory device.

56. The electronic device of claim 43, wherein the semiconductor device includes an PMOS transistor of a CMOS structure with the high temperature chemical vapor deposited silicon oxynitride layer configured on the PMOS transistor to provide a compressive strained silicon channel in a CMOS logic device.

57. The electronic device of claim 43, wherein the semiconductor device includes a source and a drain separated by the silicon channel with SiGe regions in both the source and the drain.

58. The electronic device of claim 43, wherein the semiconductor device includes a source and a drain separated by the silicon channel and a SiGe layer between the source and the drain with the silicon channel being disposed on the SiGe layer.

59. The electronic device of claim 43, wherein the substrate includes a silicon substrate.

60. The electronic device of claim 43, wherein the substrate includes a SiGe substrate.

61. The electronic device of claim 43, wherein the electronic device includes a conductive path to the semiconductor device to provide a signal to the semiconductor device to operate in an electronic system.

* * * * *